(12) United States Patent
Huemoeller et al.

(10) Patent No.: US 7,361,533 B1
(45) Date of Patent: Apr. 22, 2008

(54) STACKED EMBEDDED LEADFRAME

(75) Inventors: Ronald Patrick Huemoeller, Chandler, AZ (US); Sukianto Rusli, Phoenix, AZ (US); David Jon Hiner, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 141 days.

(21) Appl. No.: 11/297,050

(22) Filed: Dec. 7, 2005

Related U.S. Application Data

(63) Continuation-in-part of application No. 11/123,605, filed on May 5, 2005, now Pat. No. 7,192,807, which is a continuation-in-part of application No. 10/868,244, filed on Jun. 15, 2004, now Pat. No. 7,190,062, and a continuation-in-part of application No. 10/291,050, filed on Nov. 8, 2002, now Pat. No. 6,905,914.

(51) Int. Cl.
  *H01L 21/00* (2006.01)
  *H01L 23/495* (2006.01)

(52) U.S. Cl. .............. 438/123; 257/666; 257/E21.499; 257/E23.056

(58) Field of Classification Search .............. 438/118, 438/125; 257/23.042, 23.049, 23.05, 23.056
  See application file for complete search history.

(56) References Cited

U.S. PATENT DOCUMENTS

| | | | |
|---|---|---|---|
| 2,596,993 A | 5/1952 | Gookin ..................... | 18/36 |
| 3,435,815 A | 4/1969 | Forcier ..................... | 125/16 |
| 3,734,660 A | 5/1973 | Davies et al. .............. | 425/123 |
| 3,838,984 A | 10/1974 | Crane et al. ............... | 29/193.5 |
| 4,054,238 A | 10/1977 | Lloyd et al. .............. | 228/173 R |
| 4,189,342 A | 2/1980 | Kock ......................... | 156/656 |
| 4,258,381 A | 3/1981 | Inaba ......................... | 357/70 |
| 4,289,922 A | 9/1981 | Devlin ...................... | 174/52 FP |
| 4,301,464 A | 11/1981 | Otsuki et al. ............. | 357/70 |
| 4,332,537 A | 6/1982 | Slepcevic ................ | 425/121 |
| 4,417,266 A | 11/1983 | Grabbe ..................... | 357/80 |
| 4,451,224 A | 5/1984 | Harding .................... | 425/548 |
| 4,530,152 A | 7/1985 | Roche et al. ............. | 29/588 |

(Continued)

FOREIGN PATENT DOCUMENTS

DE 197 34 794 7/1998

(Continued)

OTHER PUBLICATIONS

Huemoeller et al., U.S. Appl. No. 11/047,848, filed Jan. 31, 2005, entitled "Two-Sided Wafer Escape Package".

(Continued)

*Primary Examiner*—Lex Malsawma
(74) *Attorney, Agent, or Firm*—Gunnison, McKay & Hodgson, L.L.P.; Serge J. Hodgson

(57) ABSTRACT

A method of forming a stackable embedded leadframe package includes coupling an electronic component having bond pads to a substrate; coupling on the substrate a leadframe having a plurality of leads, each lead having a lower mounting portion; encapsulating the electronic component and partially encapsulating the leadframe; singulating each lead; forming via apertures through the substrate to expose the bond pads and the lower mounting portions; and filling the via apertures with an electrically conductive material to form vias electrically coupled to the bond pads and to the lower mounting portions. This permits stacking of electronic components in a small geometry.

20 Claims, 24 Drawing Sheets

U.S. PATENT DOCUMENTS

| | | | |
|---|---|---|---|
| 4,541,003 A | 9/1985 | Otsuka et al. | 357/74 |
| 4,646,710 A | 3/1987 | Schmid et al. | 125/16 R |
| 4,707,724 A | 11/1987 | Suzuki et al. | 357/71 |
| 4,727,633 A | 3/1988 | Herrick | 228/122 |
| 4,737,839 A | 4/1988 | Burt | 357/67 |
| 4,756,080 A | 7/1988 | Thorp, Jr. et al. | 29/827 |
| 4,812,896 A | 3/1989 | Rothgery et al. | 357/70 |
| 4,862,245 A | 8/1989 | Pashby et al. | 357/70 |
| 4,862,246 A | 8/1989 | Masuda et al. | 357/70 |
| 4,907,067 A | 3/1990 | Derryberry | 357/74 |
| 4,920,074 A | 4/1990 | Shimizu et al. | 437/211 |
| 4,935,803 A | 6/1990 | Kalfus et al. | 357/68 |
| 4,942,454 A | 7/1990 | Mori et al. | 357/70 |
| 4,987,475 A | 1/1991 | Schlesinger et al. | 357/70 |
| 5,018,003 A | 5/1991 | Yasunaga et al. | 357/72 |
| 5,029,386 A | 7/1991 | Chao et al. | 29/827 |
| 5,041,902 A | 8/1991 | McShane | 357/79 |
| 5,057,900 A | 10/1991 | Yamazaki | 357/70 |
| 5,059,379 A | 10/1991 | Tsutsumi et al. | 264/272.14 |
| 5,065,223 A | 11/1991 | Matsuki et al. | 357/68 |
| 5,070,039 A | 12/1991 | Johnson et al. | 437/207 |
| 5,087,961 A | 2/1992 | Long et al. | 357/69 |
| 5,091,341 A | 2/1992 | Asada et al. | 437/212 |
| 5,096,852 A | 3/1992 | Hobson | 437/207 |
| 5,118,298 A | 6/1992 | Murphy | 439/68 |
| 5,122,860 A | 6/1992 | Kikuchi et al. | 357/72 |
| 5,134,773 A | 8/1992 | LeMaire et al. | 29/827 |
| 5,151,039 A | 9/1992 | Murphy | 439/70 |
| 5,157,475 A | 10/1992 | Yamaguchi | 357/68 |
| 5,157,480 A | 10/1992 | McShane et al. | 357/74 |
| 5,168,368 A | 12/1992 | Gow, 3rd et al. | 257/666 |
| 5,172,213 A | 12/1992 | Zimmerman | 257/796 |
| 5,172,214 A | 12/1992 | Casto | 257/676 |
| 5,175,060 A | 12/1992 | Enomoto et al. | 428/620 |
| 5,200,362 A | 4/1993 | Lin et al. | 437/207 |
| 5,200,809 A | 4/1993 | Kwon | 257/707 |
| 5,214,845 A | 6/1993 | King et al. | 29/841 |
| 5,216,278 A | 6/1993 | Lin et al. | 257/688 |
| 5,218,231 A | 6/1993 | Kudo | 257/735 |
| 5,221,642 A | 6/1993 | Burns | 437/207 |
| 5,250,841 A | 10/1993 | Sloan et al. | 257/666 |
| 5,252,853 A | 10/1993 | Michii | 257/666 |
| 5,258,094 A | 11/1993 | Furui et al. | 156/634 |
| 5,266,834 A | 11/1993 | Nishi et al. | 257/706 |
| 5,273,938 A | 12/1993 | Lin et al. | 437/207 |
| 5,277,972 A | 1/1994 | Sakumoto et al. | 428/355 |
| 5,278,446 A | 1/1994 | Nagaraj et al. | 257/707 |
| 5,279,029 A | 1/1994 | Burns | 29/856 |
| 5,281,849 A | 1/1994 | Singh Deo et al. | 257/666 |
| 5,294,897 A | 3/1994 | Notani et al. | 333/33 |
| 5,327,008 A | 7/1994 | Djennas et al. | 257/666 |
| 5,332,864 A | 7/1994 | Liang et al. | 174/52.4 |
| 5,335,771 A | 8/1994 | Murphy | 206/328 |
| 5,336,931 A | 8/1994 | Juskey et al. | 257/787 |
| 5,343,076 A | 8/1994 | Katayama et al. | 257/717 |
| 5,358,905 A | 10/1994 | Chiu | 437/209 |
| 5,365,106 A | 11/1994 | Watanabe | 257/669 |
| 5,381,042 A | 1/1995 | Lerner et al. | 257/712 |
| 5,391,439 A | 2/1995 | Tomita et al. | 428/571 |
| 5,394,303 A | 2/1995 | Yamaji | 361/749 |
| 5,406,124 A | 4/1995 | Morita et al. | 257/783 |
| 5,410,180 A | 4/1995 | Fuji et al. | 257/666 |
| 5,414,299 A | 5/1995 | Wang et al. | 257/702 |
| 5,417,905 A | 5/1995 | Lemaire et al. | 264/139 |
| 5,424,576 A | 6/1995 | Djennas et al. | 257/666 |
| 5,428,248 A | 6/1995 | Cha | 257/676 |
| 5,435,057 A | 7/1995 | Bindra et al. | 29/830 |
| 5,444,301 A | 8/1995 | Song et al. | 257/737 |
| 5,452,511 A | 9/1995 | Chang | 29/827 |
| 5,454,905 A | 10/1995 | Fogelson | 156/651.1 |
| 5,474,958 A | 12/1995 | Djennas et al. | 437/211 |
| 5,484,274 A | 1/1996 | Neu | 425/116 |
| 5,493,151 A | 2/1996 | Asada et al. | 257/686 |
| 5,508,556 A | 4/1996 | Lin | 257/691 |
| 5,517,056 A | 5/1996 | Bigler et al. | 257/666 |
| 5,521,429 A | 5/1996 | Aono et al. | 257/676 |
| 5,528,076 A | 6/1996 | Pavio | 257/666 |
| 5,534,467 A | 7/1996 | Rostoker | 437/209 |
| 5,539,251 A | 7/1996 | Iverson et al. | 257/670 |
| 5,543,657 A | 8/1996 | Diffenderfer et al. | 257/666 |
| 5,544,412 A | 8/1996 | Romero et al. | 29/832 |
| 5,545,923 A | 8/1996 | Barber | 257/691 |
| 5,581,122 A | 12/1996 | Chao et al. | 257/691 |
| 5,592,019 A | 1/1997 | Ueda et al. | 257/666 |
| 5,592,025 A | 1/1997 | Clark et al. | 257/774 |
| 5,594,274 A | 1/1997 | Suetaki | 257/667 |
| 5,595,934 A | 1/1997 | Kim | 437/180 |
| 5,604,376 A | 2/1997 | Hamburgen et al. | 257/676 |
| 5,608,265 A | 3/1997 | Kitano et al. | 257/738 |
| 5,608,267 A | 3/1997 | Mahulikar et al. | 257/796 |
| 5,619,068 A * | 4/1997 | Benzoni | 257/690 |
| 5,625,222 A | 4/1997 | Yoneda et al. | 257/687 |
| 5,633,528 A | 5/1997 | Abbott et al. | 257/666 |
| 5,639,990 A | 6/1997 | Nishihara et al. | 174/52.2 |
| 5,640,047 A | 6/1997 | Nakashima | 257/738 |
| 5,641,997 A | 6/1997 | Ohta et al. | 257/788 |
| 5,643,433 A | 7/1997 | Fukase et al. | 205/78 |
| 5,644,169 A | 7/1997 | Chun | 257/787 |
| 5,646,831 A | 7/1997 | Manteghi | 361/813 |
| 5,650,663 A | 7/1997 | Parthasarathi | 257/706 |
| 5,661,088 A | 8/1997 | Tessier et al. | 29/841 |
| 5,665,996 A | 9/1997 | Williams et al. | 257/401 |
| 5,673,479 A | 10/1997 | Hawthorne | 29/832 |
| 5,683,806 A | 11/1997 | Sakumoto et al. | 428/343 |
| 5,689,135 A | 11/1997 | Ball | 257/676 |
| 5,696,666 A | 12/1997 | Miles et al. | 361/764 |
| 5,701,034 A | 12/1997 | Marrs | 257/706 |
| 5,703,407 A | 12/1997 | Hori | 257/783 |
| 5,710,064 A | 1/1998 | Song et al. | 437/220 |
| 5,723,899 A | 3/1998 | Shin | 257/666 |
| 5,724,233 A | 3/1998 | Honda et al. | 361/813 |
| 5,726,493 A | 3/1998 | Yamashita et al. | 257/698 |
| 5,736,432 A | 4/1998 | Mackessy | 438/123 |
| 5,745,984 A | 5/1998 | Cole, Jr. et al. | 29/834 |
| 5,753,532 A | 5/1998 | Sim | 437/217 |
| 5,753,977 A | 5/1998 | Kusaka et al. | 257/787 |
| 5,766,972 A | 6/1998 | Takahashi et al. | 438/127 |
| 5,769,989 A | 6/1998 | Hoffmeyer et al. | 156/94 |
| 5,770,888 A | 6/1998 | Song et al. | 257/696 |
| 5,776,798 A | 7/1998 | Quan et al. | 438/112 |
| 5,783,861 A | 7/1998 | Son | 253/693 |
| 5,786,238 A | 7/1998 | Pai et al. | 438/118 |
| 5,801,440 A | 9/1998 | Chu et al. | 257/691 |
| 5,814,877 A | 9/1998 | Diffenderfer et al. | 257/666 |
| 5,814,881 A | 9/1998 | Alagaratnam et al. | 257/686 |
| 5,814,883 A | 9/1998 | Sawai et al. | 257/712 |
| 5,814,884 A | 9/1998 | Davis et al. | 257/723 |
| 5,817,540 A | 10/1998 | Wark | 438/107 |
| 5,818,105 A | 10/1998 | Kouda | 257/696 |
| 5,821,457 A | 10/1998 | Mosley et al. | 174/52.4 |
| 5,821,615 A | 10/1998 | Lee | 257/686 |
| 5,834,830 A | 11/1998 | Cho | 257/667 |
| 5,835,988 A | 11/1998 | Ishii | 257/684 |
| 5,841,193 A | 11/1998 | Eichelberger | 257/723 |
| 5,844,306 A | 12/1998 | Fujita et al. | 257/676 |
| 5,856,911 A | 1/1999 | Riley | 361/704 |
| 5,859,471 A | 1/1999 | Kuraishi et al. | 257/666 |
| 5,866,939 A | 2/1999 | Shin et al. | 257/666 |
| 5,871,782 A | 2/1999 | Choi | 425/116 |
| 5,874,784 A | 2/1999 | Aoki et al. | 257/787 |
| 5,877,043 A | 3/1999 | Alcoe et al. | 438/123 |
| 5,886,397 A | 3/1999 | Ewer | 257/667 |
| 5,886,398 A | 3/1999 | Low et al. | 257/667 |
| 5,894,108 A | 4/1999 | Mostafazadeh et al. | 174/52.4 |

| Patent No. | Date | Inventor(s) | Class/Subclass |
|---|---|---|---|
| 5,897,339 A | 4/1999 | Song et al. | 438/118 |
| 5,900,676 A | 5/1999 | Kweon et al. | 257/787 |
| 5,903,049 A | 5/1999 | Mori | 257/686 |
| 5,903,050 A | 5/1999 | Thurairajaratnam et al. | 257/695 |
| 5,909,053 A | 6/1999 | Fukase et al. | 257/666 |
| 5,915,998 A | 6/1999 | Stidham et al. | 439/723 |
| 5,917,242 A | 6/1999 | Ball | 257/737 |
| 5,937,324 A | 8/1999 | Abercrombie et al. | 438/648 |
| 5,939,779 A | 8/1999 | Kim | 257/692 |
| 5,942,794 A | 8/1999 | Okumura et al. | 257/666 |
| 5,951,305 A | 9/1999 | Haba | 439/70 |
| 5,959,356 A | 9/1999 | Oh | 257/738 |
| 5,969,426 A | 10/1999 | Baba et al. | 257/778 |
| 5,973,388 A | 10/1999 | Chew et al. | 257/676 |
| 5,976,912 A | 11/1999 | Fukutomi et al. | 438/110 |
| 5,977,613 A | 11/1999 | Takata et al. | 257/666 |
| 5,977,615 A | 11/1999 | Yamaguchi et al. | 257/666 |
| 5,977,630 A | 11/1999 | Woodworth et al. | 257/712 |
| 5,981,314 A | 11/1999 | Glenn et al. | 438/127 |
| 5,986,333 A | 11/1999 | Nakamura | 257/667 |
| 5,986,885 A | 11/1999 | Wyland | 361/704 |
| 6,001,671 A | 12/1999 | Fjelstad | 438/112 |
| 6,013,947 A | 1/2000 | Lim | 257/685 |
| 6,018,189 A | 1/2000 | Mizuno | 257/668 |
| 6,020,625 A | 2/2000 | Qin et al. | 257/666 |
| 6,025,640 A | 2/2000 | Yagi et al. | 257/666 |
| 6,031,279 A | 2/2000 | Lenz | 257/686 |
| RE36,613 E | 3/2000 | Ball | 257/777 |
| 6,034,423 A | 3/2000 | Mostafazadeh et al. | 257/691 |
| 6,040,626 A | 3/2000 | Cheah et al. | 257/735 |
| 6,043,430 A | 3/2000 | Chun | 174/52.4 |
| 6,060,768 A | 5/2000 | Hayashida et al. | 257/666 |
| 6,060,769 A | 5/2000 | Wark | 257/666 |
| 6,072,228 A | 6/2000 | Hinkle et al. | 257/666 |
| 6,075,284 A | 6/2000 | Choi et al. | 257/676 |
| 6,081,029 A | 6/2000 | Yamaguchi | 257/718 |
| 6,084,310 A | 7/2000 | Mizuno et al. | 257/779 |
| 6,087,715 A | 7/2000 | Sawada et al. | 257/666 |
| 6,087,722 A | 7/2000 | Lee et al. | 257/723 |
| 6,100,594 A | 8/2000 | Fukui et al. | 257/777 |
| 6,113,474 A | 9/2000 | Shih et al. | 451/72 |
| 6,114,752 A | 9/2000 | Huang et al. | 257/666 |
| 6,118,174 A | 9/2000 | Kim | 257/666 |
| 6,118,184 A | 9/2000 | Ishio et al. | 257/787 |
| RE36,907 E | 10/2000 | Templeton, Jr. et al. | 257/666 |
| 6,130,115 A | 10/2000 | Okumura et al. | 438/124 |
| 6,130,473 A | 10/2000 | Mostafazadeh et al. | 257/666 |
| 6,133,623 A | 10/2000 | Otsuki et al. | 257/666 |
| 6,140,154 A | 10/2000 | Hinkle et al. | 438/123 |
| 6,143,981 A | 11/2000 | Glenn | 174/52.4 |
| 6,169,329 B1 | 1/2001 | Farnworth et al. | 257/780 |
| 6,177,718 B1 | 1/2001 | Kozono | 257/666 |
| 6,181,002 B1 | 1/2001 | Juso et al. | 257/686 |
| 6,184,465 B1 | 2/2001 | Corisis | 174/52.4 |
| 6,184,573 B1 | 2/2001 | Pu | 257/666 |
| 6,194,777 B1 | 2/2001 | Abbott et al. | 257/666 |
| 6,197,615 B1 | 3/2001 | Song et al. | 438/111 |
| 6,198,171 B1 | 3/2001 | Huang et al. | 257/787 |
| 6,201,186 B1 | 3/2001 | Daniels et al. | 174/52.4 |
| 6,201,292 B1 | 3/2001 | Yagi et al. | 257/666 |
| 6,204,554 B1 | 3/2001 | Ewer et al. | 257/705 |
| 6,208,020 B1 | 3/2001 | Minamio et al. | 257/684 |
| 6,208,021 B1 | 3/2001 | Ohuchi et al. | 257/690 |
| 6,208,023 B1 | 3/2001 | Nakayama et al. | 257/696 |
| 6,211,462 B1 | 4/2001 | Carter, Jr. et al. | 174/52.4 |
| 6,218,731 B1 | 4/2001 | Huang et al. | 257/738 |
| 6,222,258 B1 | 4/2001 | Asano et al. | 257/675 |
| 6,222,259 B1 | 4/2001 | Park et al. | 257/690 |
| 6,225,146 B1 | 5/2001 | Yamaguchi et al. | 438/123 |
| 6,229,200 B1 | 5/2001 | Mclellan et al. | 257/666 |
| 6,229,205 B1 | 5/2001 | Jeong et al. | 257/676 |
| 6,239,367 B1 | 5/2001 | Hsuan et al. | 174/52.4 |
| 6,239,384 B1 | 5/2001 | Smith et al. | 174/261 |
| 6,242,281 B1 | 6/2001 | Mclellan et al. | 438/106 |
| 6,256,200 B1 | 7/2001 | Lam et al. | 361/704 |
| 6,258,192 B1 | 7/2001 | Natarajan | 156/89.15 |
| 6,258,629 B1 | 7/2001 | Niones et al. | 438/111 |
| 6,261,918 B1 | 7/2001 | So | 438/401 |
| 6,281,566 B1 | 8/2001 | Magni | 257/666 |
| 6,281,568 B1 | 8/2001 | Glenn et al. | 257/684 |
| 6,282,095 B1 | 8/2001 | Houghton et al. | 361/704 |
| 6,285,075 B1 | 9/2001 | Combs et al. | 257/675 |
| 6,291,271 B1 | 9/2001 | Lee et al. | 438/121 |
| 6,291,273 B1 | 9/2001 | Miyaki et al. | 438/123 |
| 6,294,100 B1 | 9/2001 | Fan et al. | 216/14 |
| 6,294,830 B1 | 9/2001 | Fjelstad | 257/724 |
| 6,295,977 B1 | 10/2001 | Ripper et al. | 125/16.02 |
| 6,297,548 B1 | 10/2001 | Moden et al. | 257/686 |
| 6,303,984 B1 | 10/2001 | Corisis | 257/670 |
| 6,303,997 B1 | 10/2001 | Lee | 257/778 |
| 6,307,272 B1 | 10/2001 | Takahashi et al. | 257/787 |
| 6,309,909 B1 | 10/2001 | Ohgiyama | 438/112 |
| 6,316,822 B1 | 11/2001 | Venkateshwaran et al. | 257/666 |
| 6,316,838 B1 | 11/2001 | Ozawa et al. | 257/778 |
| 6,323,550 B1 | 11/2001 | Martin et al. | 257/704 |
| 6,326,243 B1 | 12/2001 | Suzuya et al. | 438/124 |
| 6,326,244 B1 | 12/2001 | Brooks et al. | 438/124 |
| 6,326,678 B1 | 12/2001 | Karnezos et al. | 257/666 |
| 6,335,564 B1 | 1/2002 | Pour | 257/666 |
| 6,337,510 B1 | 1/2002 | Chun-Jen et al. | 257/666 |
| 6,339,255 B1 | 1/2002 | Shin | 257/686 |
| 6,348,726 B1 | 2/2002 | Bayan et al. | 257/666 |
| 6,355,502 B1 | 3/2002 | Kang et al. | 438/110 |
| 6,369,447 B2 | 4/2002 | Mori | 257/777 |
| 6,369,454 B1 | 4/2002 | Chung | 257/787 |
| 6,373,127 B1 | 4/2002 | Baudouin et al. | 257/676 |
| 6,380,048 B1 | 4/2002 | Boon et al. | 438/456 |
| 6,384,472 B1 | 5/2002 | Huang | 257/680 |
| 6,388,336 B1 | 5/2002 | Venkateshwaran et al. | 257/779 |
| 6,395,578 B1 | 5/2002 | Shin et al. | 438/106 |
| 6,400,004 B1 | 6/2002 | Fan et al. | 257/666 |
| 6,410,979 B2 | 6/2002 | Abe | 257/684 |
| 6,414,385 B1 | 7/2002 | Huang et al. | 257/690 |
| 6,420,779 B1 | 7/2002 | Sharma et al. | 257/666 |
| 6,429,508 B1 | 8/2002 | Gang | 257/678 |
| 6,437,429 B1 | 8/2002 | Su et al. | 257/666 |
| 6,444,499 B1 | 9/2002 | Swiss et al. | 438/127 |
| 6,448,633 B1 | 9/2002 | Yee et al. | 257/666 |
| 6,452,279 B2 | 9/2002 | Shimoda | 257/777 |
| 6,459,148 B1 | 10/2002 | Chun-Jen et al. | 257/692 |
| 6,464,121 B2 | 10/2002 | Reijnders | 225/103 |
| 6,476,469 B2 | 11/2002 | Hung et al. | 257/676 |
| 6,476,474 B1 | 11/2002 | Hung | 257/686 |
| 6,482,680 B1 | 11/2002 | Khor et al. | 438/123 |
| 6,498,099 B1 | 12/2002 | McLellan et al. | 438/689 |
| 6,498,392 B2 | 12/2002 | Azuma | 257/676 |
| 6,507,096 B2 | 1/2003 | Gang | 257/678 |
| 6,507,120 B2 | 1/2003 | Lo et al. | 257/778 |
| 6,521,530 B2 | 2/2003 | Peters et al. | 438/667 |
| 6,524,885 B2 | 2/2003 | Pierce | 438/106 |
| 6,534,849 B1 | 3/2003 | Gang | 257/678 |
| 6,545,332 B2 | 4/2003 | Huang | 257/433 |
| 6,545,345 B1 | 4/2003 | Glenn et al. | 257/676 |
| 6,559,525 B2 | 5/2003 | Huang | 257/675 |
| 6,566,168 B2 | 5/2003 | Gang | 438/112 |
| 6,583,503 B2 | 6/2003 | Akram et al. | 257/686 |
| 6,593,645 B2 | 7/2003 | Shih et al. | 257/686 |
| 6,603,196 B2 | 8/2003 | Lee et al. | 257/676 |
| 6,624,005 B1 | 9/2003 | DiCaprio et al. | 438/113 |
| 6,667,546 B2 | 12/2003 | Huang et al. | 257/691 |
| 6,671,398 B2 | 12/2003 | Reinhorn et al. | 382/145 |
| 6,727,576 B2 | 4/2004 | Hedler et al. | 257/678 |
| 6,831,371 B1 | 12/2004 | Huemoeller et al. | 257/778 |
| 6,838,776 B2 | 1/2005 | Leal et al. | 257/783 |
| 6,845,554 B2 | 1/2005 | Frankowsky et al. | 29/832 |

| | | | | | | |
|---|---|---|---|---|---|---|
| 6,905,914 | B1 | 6/2005 | Huemoeller et al. ........ 438/118 | JP | 01-205544 | 8/1989 |
| 6,921,975 | B2 | 7/2005 | Leal et al. .................. 257/723 | JP | 01-251747 | 10/1989 |
| 6,930,256 | B1 | 8/2005 | Huemoeller et al. ........ 174/260 | JP | 02-129948 | 5/1990 |
| 7,015,075 | B2 | 3/2006 | Fay et al. .................... 438/127 | JP | 03-069248 | 7/1991 |
| 7,041,534 | B2 | 5/2006 | Chao et al. ................. 438/114 | JP | 03-177060 | 8/1991 |
| 7,192,807 | B1 | 3/2007 | Huemoeller et al. ........ 438/118 | JP | 04-098864 | 3/1992 |
| 2001/0008305 | A1 | 7/2001 | McLellan et al. ........... 257/692 | JP | 05-129473 | 5/1993 |
| 2001/0011654 | A1 | 8/2001 | Schmidt et al. ............. 219/746 | JP | 05-166992 | 7/1993 |
| 2001/0014538 | A1 | 8/2001 | Kwan et al. ................ 438/690 | JP | 05-283460 | 10/1993 |
| 2002/0024122 | A1 | 2/2002 | Jung et al. .................. 257/666 | JP | 06-092076 | 4/1994 |
| 2002/0027297 | A1 | 3/2002 | Ikenaga et al. ............. 257/784 | JP | 06-140563 | 5/1994 |
| 2002/0061642 | A1 | 5/2002 | Haji et al. ................... 438/613 | JP | 06-260532 | 9/1994 |
| 2002/0140061 | A1 | 10/2002 | Lee ............................. 257/666 | JP | 07-297344 | 11/1995 |
| 2002/0140068 | A1 | 10/2002 | Lee et al. .................... 257/676 | JP | 07-312405 | 11/1995 |
| 2002/0163015 | A1 | 11/2002 | Lee et al. .................... 257/200 | JP | 08-064634 | 3/1996 |
| 2003/0013232 | A1 | 1/2003 | Towle et al. ................ 438/113 | JP | 08-083877 | 3/1996 |
| 2003/0030131 | A1 | 2/2003 | Lee et al. .................... 257/666 | JP | 08-125066 | 5/1996 |
| 2003/0073265 | A1 | 4/2003 | Hu et al. ..................... 438/123 | JP | 08-222682 | 8/1996 |
| 2003/0134455 | A1 | 7/2003 | Cheng et al. ............... 438/125 | JP | 08-306853 | 11/1996 |
| 2004/0056277 | A1 | 3/2004 | Karnezos .................... 257/200 | JP | 09-008205 | 1/1997 |
| 2004/0061212 | A1 | 4/2004 | Karnezos .................... 257/686 | JP | 09-008206 | 1/1997 |
| 2004/0061213 | A1 | 4/2004 | Karnezos .................... 257/686 | JP | 09-008207 | 1/1997 |
| 2004/0063242 | A1 | 4/2004 | Karnezos .................... 438/106 | JP | 09-092775 | 4/1997 |
| 2004/0063246 | A1 | 4/2004 | Karnezos .................... 438/108 | JP | 09-293822 | 11/1997 |
| 2005/0242425 | A1 | 11/2005 | Leal et al. .................. 257/690 | JP | 10-022447 | 1/1998 |
| 2005/0282314 | A1 | 12/2005 | Lo et al. ..................... 438/117 | JP | 10-163401 | 6/1998 |
| | | | | JP | 10-199934 | 7/1998 |
| | | | | JP | 10-256240 | 9/1998 |

FOREIGN PATENT DOCUMENTS

| | | |
|---|---|---|
| EP | 0 393 997 | 10/1990 |
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |

OTHER PUBLICATIONS

Huemoeller et al., U.S. Appl. No. 11/298,016, filed Dec. 8, 2005, entitled "Embedded Electronic Component Package".

Huemoeller et al., U.S. Appl. No. 10/261,868, filed Oct. 1, 2002, entitled "Integrated Circuit Film Substrate Having Embedded Conductive Patterns and Vias".

Sheridan et al., U.S. Appl. No. 10/868,244, filed Jun. 15, 2004, entitled "Embedded Leadframe Semiconductor Package".

Lee et al., U.S. Appl. No. 11/440,548, filed May 24, 2006, entitled "Substrate for Semiconductor Device and Manufacturing Method Thereof".

Huemoeller et al., U.S. Appl. No. 11/605,740, filed Nov. 28, 2006, entitled "Electronic Component Package Comprising Fan-Out and Fan-In Traces".

Huemoeller et al., U.S. Appl. No. 11/784,979, filed Apr. 9, 2007, entitled "Two-Sided Wafer Escape Package".

Berry et al., U.S. Appl. No. 11/810,799, filed Jun. 6, 2006, entitled "Direct-Write Wafer Level Chip Scale Package".

* cited by examiner

STACKED EMBEDDED LEADFRAME

RELATED APPLICATIONS

This application is a continuation-in-part of U.S. Ser. No. 11/123,605, filed May 5, 2005, issued as U.S. Pat. No. 7,192,807, which is a continuation of U.S. Ser. No. 10/291,050, filed Nov. 8, 2002, issued as U.S. Pat. No. 6,905,914 and this application is a continuation-in-part of U.S. Ser. No. 10/868,244, filed Jun. 15, 2004, issued as U.S. Pat. No. 7,190,062. This application incorporates herein each of the foregoing applications in their entirety.

BACKGROUND OF THE INVENTION

1. Field of the Invention

The present invention relates generally to the packaging of electronic components. More particularly, the present invention relates to an electronic component package and method of fabricating the same.

2. Description of the Related Art

One form of an electronic component package included an electronic component such as an integrated circuit chip mounted to a substrate. For example, in a wirebond configuration, bond wires were used to form the electrical interconnections between bond pads on a front surface of the electronic component and electrically conductive traces on the substrate.

In the wirebond configuration described above, however, traces of the substrate were fanned out around the integrated circuit chip, which placed a fundamental restriction on the minimum electronic component package size. Further, a large impedance was associated with the bond wires.

To allow a further reduction in the electronic component package size as well as to reduce impedance of the interconnections, a flip chip configuration was used instead of a wirebond configuration. In a flip chip configuration, the bond pads on the front surface of the integrated circuit chip were directly connected to traces on the substrate with flip chip bumps, e.g., solder. This avoided the need to fan out traces around the integrated circuit chip resulting in a minimum package size. Further, the use of flip chip bumps between the bond pads and traces on the substrate minimized impedance.

However, the flip chip bumps between the bond pads of the integrated circuit chip and traces on the substrate were subject to significant stress, e.g., due to differential thermal expansion between the integrated circuit chip and the substrate. Thus, failure of the flip chip bumps often occurred which decreased yield and thus increased the cost of the electronic component package.

To minimize the failure of the flip chip bumps, an underfill material was often applied between the integrated circuit chip and the substrate and around the flip chip bumps. However, the application of the underfill material required an additional manufacturing step, which increased the cost of the electronic component package.

SUMMARY OF THE INVENTION

In accordance with one embodiment, a method of forming an electronic component package includes coupling a first surface of an electronic component to a first surface of a first dielectric strip. The electronic component comprises bond pads on the first surface of the electronic component. A leadframe is coupled on the first surface of the first dielectric strip. The leadframe comprises a support plate and a plurality of leads. Each lead in the plurality of leads has a terminal portion and a lower mounting portion. The lower mounting portion is connected to the first surface of the first dielectric strip. An electronic component package body is formed by encapsulating the electronic component and partially encapsulating the leadframe such that portions of the leadframe are exposed in a principal surface of the electronic component package body. Each lead in the plurality of leads is singulated. Via apertures are formed through the first dielectric strip to expose the bond pads and the lower mounting portion of each lead in the plurality of leads. The via apertures are filled with an electrically conductive material to form vias electrically coupled to the bond pads and to the lower mounting portion of each lead in the plurality of leads.

Thus, in accordance with this embodiment of the present invention, the bond pads and the lower mounting portions of the leads are directly connected to the corresponding vias. Stated another way, the bond pads of the electronic component and lower mounting portion of each lead in the plurality of leads in the leadframe are electrically connected to the corresponding vias without the use of a solder, e.g., without the use of flip chip bumps, and without the need to form a solder wetting layer, e.g., a nickel/gold layer, on the bond pads or on the leads of the leadframe. This maximizes the reliability of the electrical connection between vias and the bond pads/leads, while at the same time minimizes impedance.

Further, since the dielectric strip is directly attached to the electronic component and the bond pads are directly connected to the corresponding vias, the use of an underfill material is obviated. This simplifies manufacturing, enhances reliability, and thus reduces cost.

Further still, the embedded leadframe permits stacking of additional electronic component packages and/or electronic components thereon. The stacking capability provides a smaller, refined geometry of individual electronic component packages and of an overall stacked assembly of multiple electronic component packages and/or electronic components.

Embodiments in accordance with the present invention are best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 25:
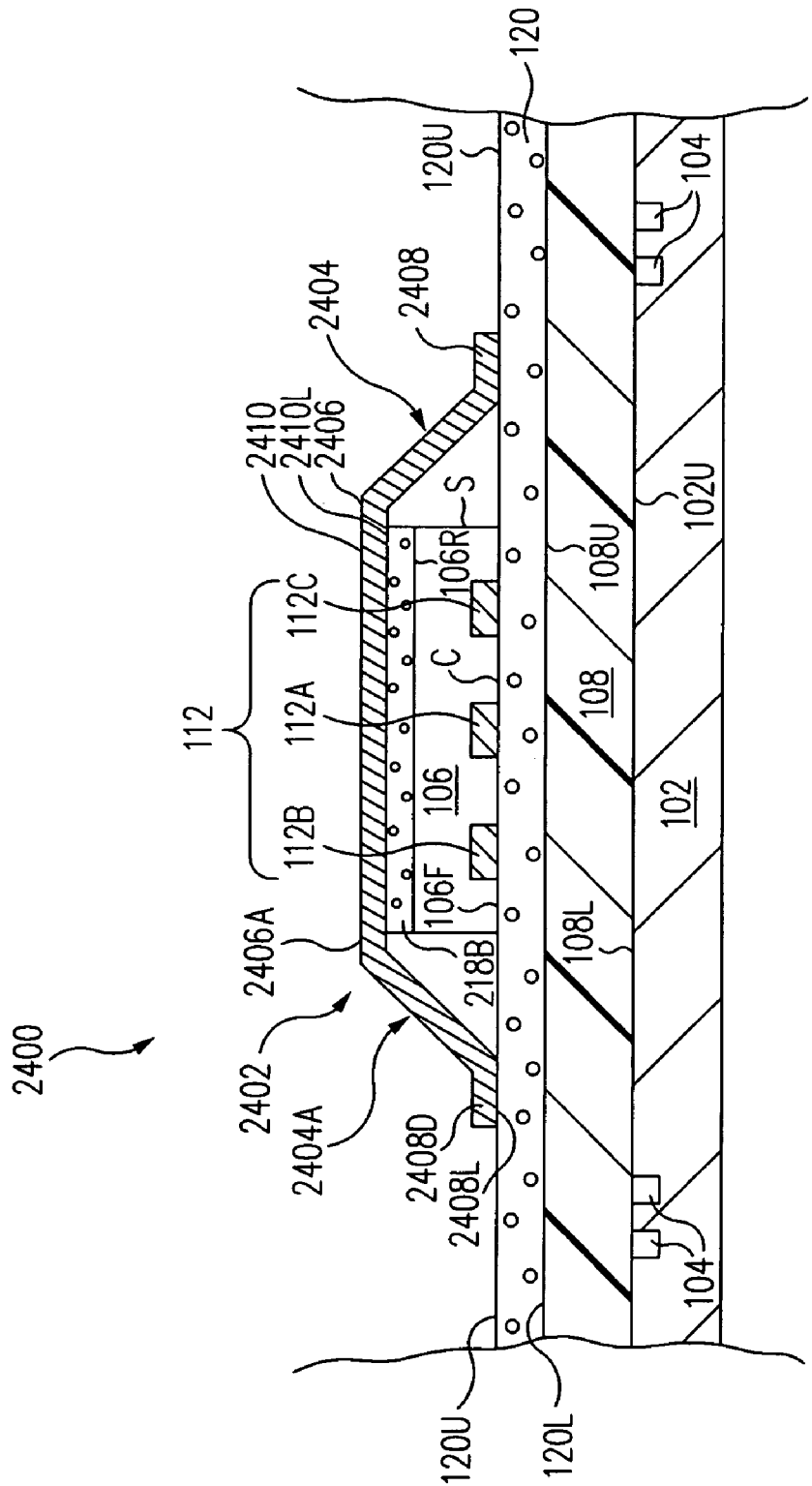
FIG. 25 is a cross-sectional view along cut line XXV-XXV of the assembly of FIG. 24 in accordance with one embodiment of the present invention.

In accordance with one embodiment of the present invention, referring to FIG. 25, a method of forming an electronic component package includes coupling a front surface 106F of a first electronic component 106 to a first surface 108U of a first dielectric strip 108, first electronic component 106 comprising bond pads 112 on first surface 106F of first electronic component 106.

A leadframe 2402 is coupled to first surface 108U of first dielectric strip 108. Leadframe 2402 comprises, for example, a support plate 2410 and a plurality of leads 2404. Each lead 2404 in the plurality of leads 2404 has a terminal portion 2406 and a lower mounting portion 2408. Lower mounting portion 2408 is connected to first surface 108U of first dielectric strip 108.

A package body 320 (FIG. 26) is formed by encapsulating first electronic component 106 and partially encapsulating leadframe 2402 such that portions of leadframe 2402 are exposed in a principal surface 320U of package body 320. Each lead 2404 in the plurality of leads 2404 is singulated (FIG. 27).

First via apertures 522 (FIG. 28) are formed through first dielectric strip 108 to expose bond pads 112 and lower mounting portion 2408 of each lead 2404 in the plurality of leads 2404. First via apertures 522 are filled with an electrically conductive material to form first vias 624 (illustrated as exemplary first vias 624A, 624B, 624C, 624D, and 624E in FIG. 29), which are electrically coupled to bond pads 112 and to lower mounting portion 2408 of each lead 2404 in the plurality of leads 2404. Thus, in accordance with this embodiment of the present invention, bond pads and lower mounting portion of each lead in the plurality of leads are directly connected to corresponding vias.

Figure 1A:
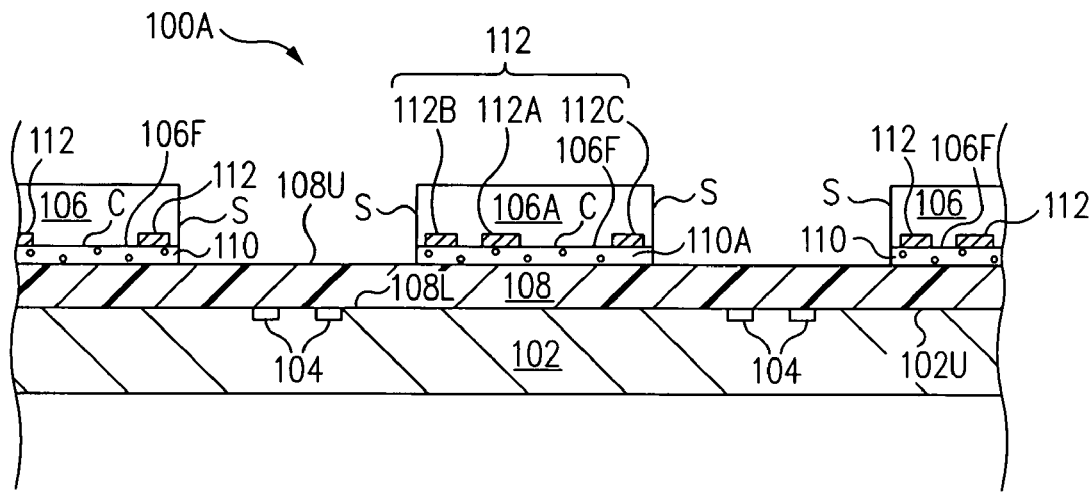
FIG. 1A is a cross-sectional view of an assembly during the fabrication of a plurality of wafer level electronic component packages in accordance with one embodiment of the present invention.

More particularly, FIG. 1A is a cross-sectional view of an assembly 100A during the fabrication of a plurality of wafer level electronic component packages in accordance with one embodiment of the present invention. Referring now to FIG. 1A, assembly 100A includes a rigid support strip 102, e.g., an aluminum, copper or stainless steel plate. Support strip 102 includes fiducials 104 on an upper, e.g., first, surface 102U of support strip 102. Fiducials 104 are used for alignment and mounting of electronic components 106, e.g., integrated circuit chips, as discussed further below.

A dielectric strip 108 is mounted to support strip 102. Electronic components 106 are mounted to dielectric strip 108 with adhesives 110, e.g., liquid adhesives or double-sided sticky tapes, although other adhesives are used in other embodiments.

To illustrate, a first electronic component 106 of the plurality of electronic components 106 is mounted to dielectric strip 108 with a first adhesive 110A of the plurality of adhesives 110. Dielectric strip 108, sometimes called a first dielectric strip, and adhesives 110 are electrical insulators, i.e., dielectrics.

More particularly, front, e.g., first, surfaces 106F of electronic components 106 are mounted to an upper, e.g., first, surface 108U of dielectric strip 108 with adhesives 110. A lower, e.g., second, surface 108L of dielectric strip 108 is mounted to upper surface 102U of support strip 102. For example, dielectric strip 108 is tacky, sometimes called sticky, and is simply pressed against support strip 102 to mount dielectric strip 108 to support strip 102. In one embodiment, adhesives 110 are applied to front surfaces 106F of electronic components 106 while electronic components 106 are still in wafer form, i.e., before they are singulated.

In one embodiment, dielectric strip 108 is transparent such that fiducials 104 are visible through dielectric strip 108. Electronic components 106 are aligned to fiducials 104 and mounted to dielectric strip 108 with adhesives 110, e.g., using an optical alignment system. Adhesives 110 are cured, if necessary.

In one embodiment, electronic components 106 are mounted in a single row on dielectric strip 108. However, in other embodiments, electronic components 106 are mounted in an array on dielectric strip 108. Illustratively, electronic components 106 are mounted in a 2×2, 3×3, . . . , or n×m array. In yet another embodiment, only a single electronic component 106 is mounted to dielectric strip 108, i.e., the wafer level electronic component package is fabricated as an individual unit instead of as one of a plurality of units fabricated simultaneously.

Formed on front surface 106F of electronic components 106 are bond pads 112, e.g., formed of aluminum. Bond pads 112 are connected to the internal circuitry of electronic components 106.

In one embodiment, bond pads 112 are distributed in an array on front surface 106F. In another embodiment, bond pads 112 are formed on front surface 106F directly adjacent sides S of electronic components 106 in a typical wirebond configuration pattern.

Figure 1B:
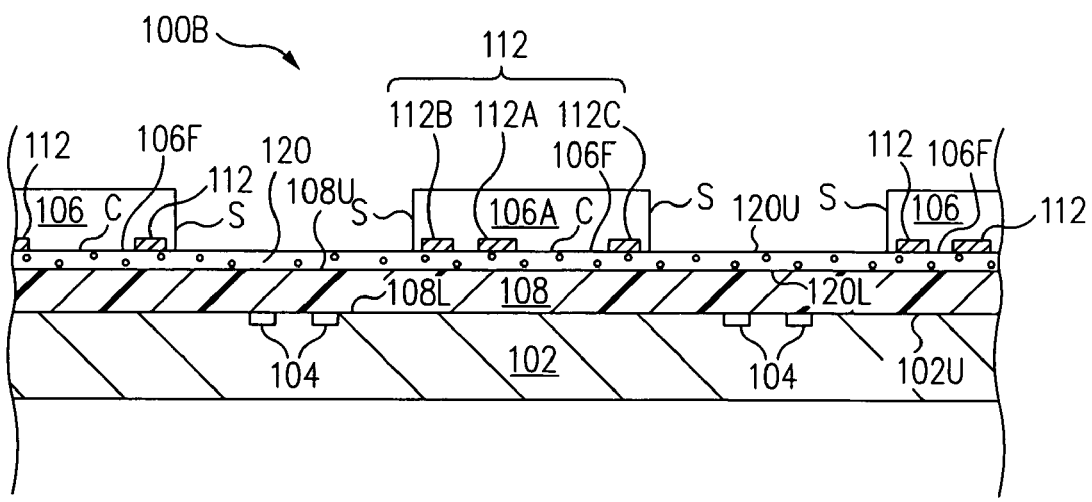
FIG. 1B is a cross-sectional view of an assembly during the fabrication of a plurality of wafer level electronic component packages in accordance with one embodiment of the present invention.

FIG. 1B is a cross-sectional view of an assembly 100B during the fabrication of a plurality of wafer level electronic component packages in accordance with another embodiment of the present invention. Assembly 100B of FIG. 1B is similar to assembly 100A of FIG. 1A and only the significant differences are discussed below.

Referring now to FIGS. 1A and 1B together, instead of mounting electronic components 106 to dielectric strip 108 using individual adhesives 110 as illustrated in FIG. 1A, an adhesive strip 120 (FIG. 1B) is used to mount electronic components 106.

Adhesive strip 120 is an electrical insulator. Illustratively, adhesive strip 120 is a liquid adhesive, for example, applied by spin coating. As another example, adhesive strip 120 is a double-sided sticky tape although other adhesives are used in other embodiments.

More particularly, a lower, e.g., first, surface 120L of adhesive strip 120 is mounted to upper surface 108U of dielectric strip 108. Front surfaces 106F of electronic components 106 are mounted to an upper, e.g., second, surface 120U of adhesive strip 120. Although use of adhesive strip 120 is illustrated in the figures which follow and discussed below for purposes of simplicity, it is to be understood that adhesives 110 (FIG. 1A) are used instead of adhesive strip 120 in an alternative embodiment.

Figure 2:
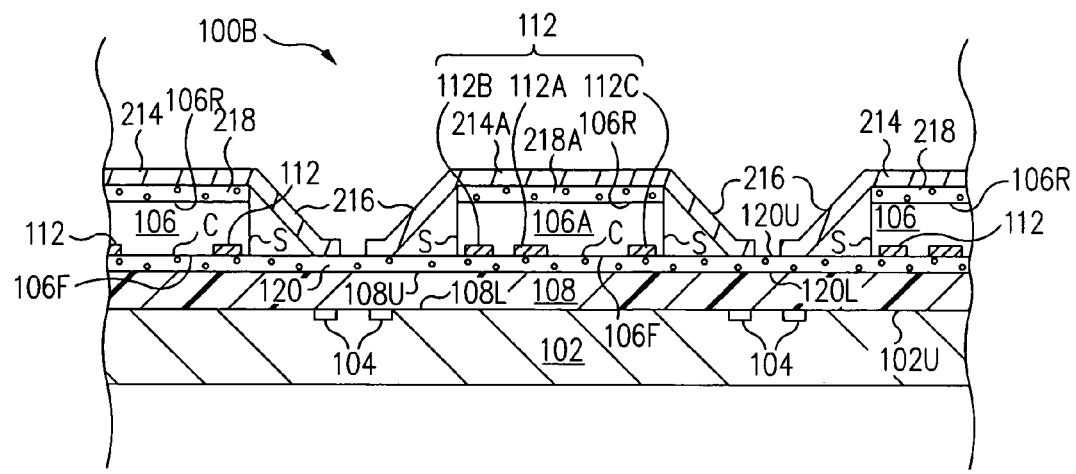
FIGS. 2, 3, 4, 5, 6, 7, 8, 9, 10 and 11 are cross-sectional views of the assembly of FIG. 1B at further stages during the fabrication of a plurality of wafer level electronic component packages in accordance with one embodiment of the present invention.

FIG. 2 is a cross-sectional view of assembly 100B of FIG. 1B at a further stage during the fabrication of a plurality of wafer level electronic component packages in accordance with one embodiment of the present invention. Referring now to FIG. 2, heat sinks 214, e.g., copper slugs, are mounted to rear, e.g., second, surfaces 106R of electronic components 106. During use, heat sinks 214 enhance heat dissipation from electronic components 106 to the ambient environment.

To illustrate, a first heat sink 214A of the plurality of heat sinks 214 is mounted to rear surface 106R of electronic component 106.

In one embodiment, legs 216 of heat sinks 214 adhere to adhesive strip 120 to hold heat sinks 214 in place. In accordance with one embodiment, a thermal pad or grease is used between heat sinks 214 and rear surfaces 106R of electronic components 106 to enhance heat transfer from electronic components 106 to heat sinks 214.

In another embodiment, adhesives 218, e.g., thermal adhesives having a relatively high heat transfer coefficient, mount heat sinks 214 to rear surface 106R of electronic components 106. To illustrate, heat sink 214A is mounted to rear surface 106R of electronic component 106 with a first adhesive 218A of the plurality of adhesives 218.

Although heat sinks 214 are not illustrated in the figures which follow or discussed further below for purposes of simplicity, it is to be understood that the assembly is fabricated to include heat sinks 214 in an alternative embodiment.

Figure 3:
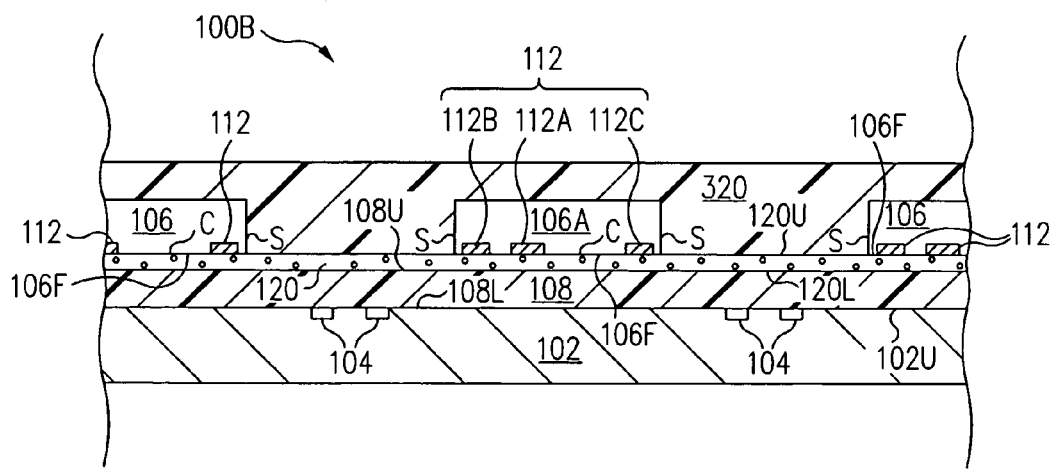

FIG. 3 is a cross-sectional view of assembly 100B of FIG. 1B at a further stage during the fabrication of a plurality of wafer level electronic component packages in accordance with one embodiment of the present invention. Referring now to FIG. 3, electronic components 106 are encapsulated, sometimes called overmolded, in an encapsulant 320. Encapsulant 320 protects electronic components 106 from the ambient environment.

Illustratively, a liquid encapsulant is applied and cured to form encapsulant 320. In another embodiment, a plastic encapsulant is applied, e.g., using a transfer or injection mold process, to form encapsulant 320.

Figure 4:
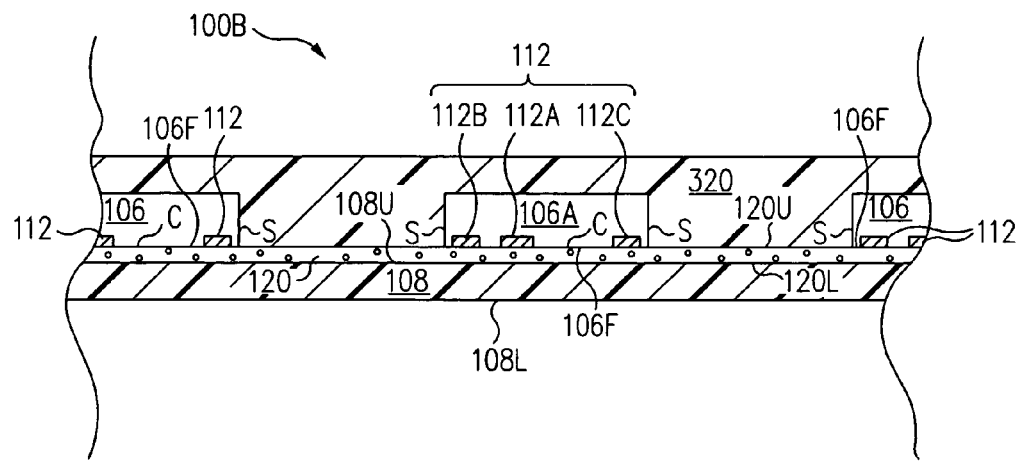

FIG. 4 is a cross-sectional view of assembly 100B of FIG. 3 at a further stage during the fabrication of a plurality of wafer level electronic component packages in accordance with one embodiment of the present invention. Referring now to FIGS. 3 and 4 together, support strip 102 is removed from dielectric strip 108. In one embodiment, upper surface 102U of support strip 102 is pretreated, e.g., a release agent is applied, to facilitate easy removal of support strip 102. In one embodiment, support strip 102 is reusable and thus reused to fabricate another assembly 100B as illustrated in FIG. 1B after removal from dielectric strip 108 thus minimizing the cost of fabricating assembly 100B.

Once support strip 102 is removed, encapsulant 320 provides rigidity and support for assembly 100B. Further, removal of support strip 102 exposes lower surface 108L of dielectric strip 108 for further processing as discussed further below.

Figure 5:
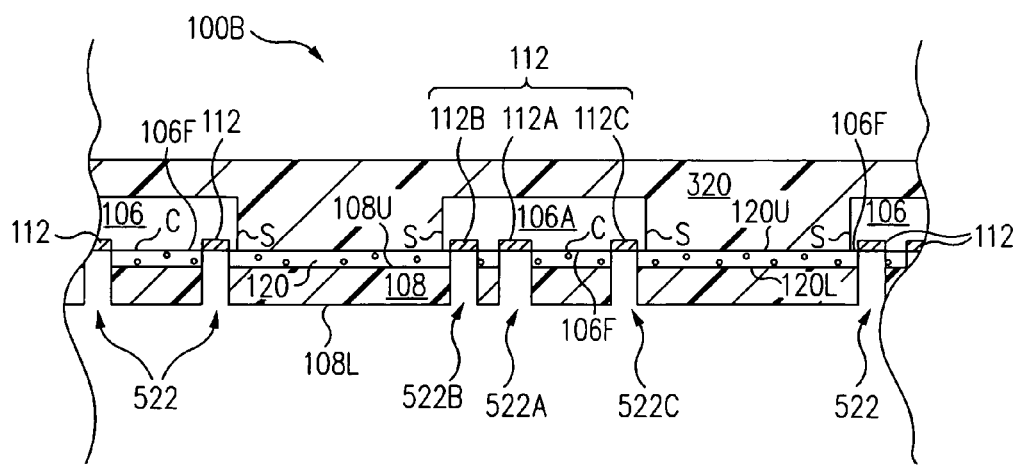

FIG. 5 is a cross-sectional view of assembly 100B of FIG. 4 at a further stage during the fabrication of a plurality of wafer level electronic component packages in accordance with one embodiment of the present invention. Referring now to FIG. 5, a plurality of via apertures 522 is formed using a laser, i.e., using laser ablation. Via apertures 522 are sometimes called first via apertures.

Via apertures 522 extend through dielectric strip 108 and through adhesive strip 120 to bond pads 112 of electronic components 106. In one embodiment, via apertures 522 are cylindrical in shape. Bond pads 112 are exposed through via apertures 522.

In one embodiment, the laser intensity is set to be sufficient to remove dielectric strip 108 and adhesive strip 120. However, the laser intensity is set to be insufficient to remove bond pads 112. Accordingly, pulsing of the laser forms a single via aperture 522 extending through dielectric strip 108 and through adhesive strip 120 to a bond pad 112 of electronic components 106. The laser is then stepped to the next location to form the next via aperture 522.

To illustrate, electronic component 106 includes bond pads 112A, 112B, and 112C on front surface 106F of electronic component 106. Via apertures 522A, 522B, 522C of the plurality of via apertures 522 extends through dielectric strip 108 and through adhesive strip 120 to bond pads 112A, 112B, and 112C, respectively.

To further illustrate, initially, the laser is pulsed to form via aperture 522A. The laser is then stepped and pulsed again to form via aperture 522B. The laser is then stepped and pulsed again to form via aperture 522C. The laser is stepped and pulsed repeatedly until all of via apertures 522 are formed. However, in another embodiment, a plurality of lasers is simultaneous pulsed to form some or all of via apertures 522 simultaneously. In yet other embodiments, via apertures 522 are formed using selective etching, mechanical drilling, or other techniques.

Figure 6:
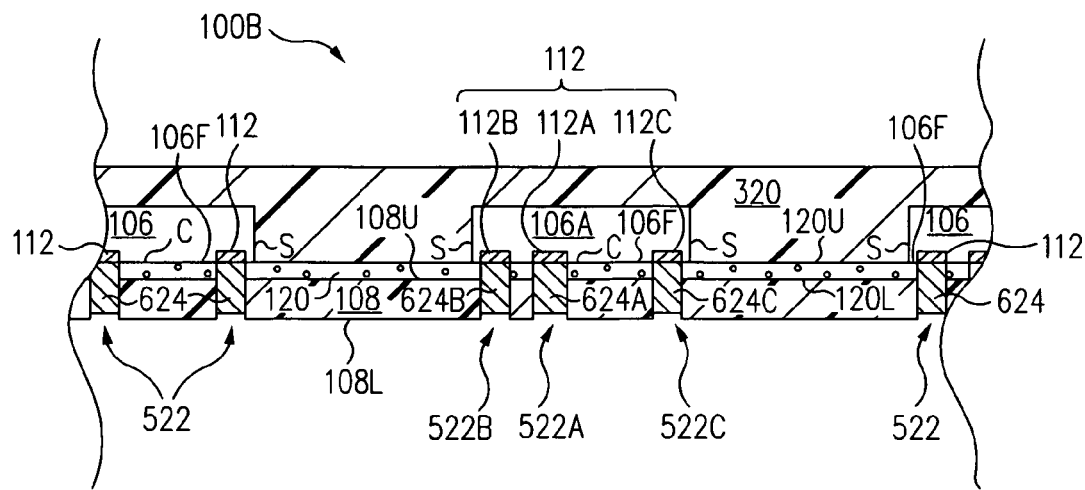

FIG. 6 is a cross-sectional view of assembly 100B of FIG. 5 at a further stage during the fabrication of a plurality of wafer level electronic component packages in accordance with one embodiment of the present invention. Referring now to FIGS. 5 and 6 together, via apertures 522 are filled with an electrically conductive material, e.g., a metal or metal containing material, an electrically conductive adhesive such as a silver filled adhesive or polymer, or solder paste, to form electrically conductive vias 624. Vias 624 are sometimes called first vias.

In one embodiment, copper or a copper containing material is plated in via apertures 522 to form vias 624. In another embodiment, via apertures 522 are filled with an electrically conductive adhesive, which is then cured if necessary, to form vias 624. In yet another embodiment, via apertures 522 are filled with a solder paste. Assembly 100B is then heated to reflow the solder paste to form vias 624.

After formation of vias 624, any excess electrically conductive material formed on lower surface 108L of dielectric strip 108 is removed. Illustratively, an etch or physical grinding process is used.

In one embodiment, an over-etch process is used to slightly over-etch vias 624. Thus, vias 624 remain recessed within via apertures 522. This ensures that shorting between vias 624 from excess electrically conductive material is avoided.

Vias 624 are electrically connected to corresponding bond pads 112. To illustrate, vias 624A, 624B, 624C of the plurality of vias 624 is electrically connected to bond pads 112A, 112B, 112C, respectively. Vias 624 extend from bond pads 112, through adhesive strip 120 and through dielectric strip 108 to be adjacent or slightly recessed from (above in the view of FIG. 6) lower surface 108L of dielectric strip 108.

Bond pads 112 are directly connected to corresponding vias 624. Stated another way, bond pads 112 are electrically connected to corresponding vias 624 without the use of a solder, e.g., without the use of flip chip bumps, and without the need to form a solder wetting layer, e.g., a nickel/gold layer, on bond pads 112. This maximizes the reliability of the electrical connection between vias 624 and bond pads 112, while at the same time minimizes impedance.

Further, since dielectric strip 108 is directly attached to electronic components 106 by adhesive strip 120 and bond pads 112 are directly connected to corresponding vias 624, the use of an underfill material is obviated. This simplifies manufacturing, enhances reliability, and thus reduces cost.

After formation of vias 624, assembly 100B is inspected, e.g., optically using an automatic inspection system, to insure that all via apertures 522 are properly filled with electrically conductive material, i.e., to inspect the integrity of vias 624. In one embodiment, any defective or unformed vias 624 detected during the inspection are corrected, e.g., by etch removal of vias 624, reapplication of the electrically conductive material to reform vias 624, e.g., re-plating, and removal of any excess electrically conductive material on lower surface 108L of dielectric strip 108.

In this manner, the wafer level electronic component packages are fabricated with a maximum yield, e.g., essentially a 100 percent yield. This further minimizes the fabrication cost of the wafer level electronic component packages.

Figure 7:
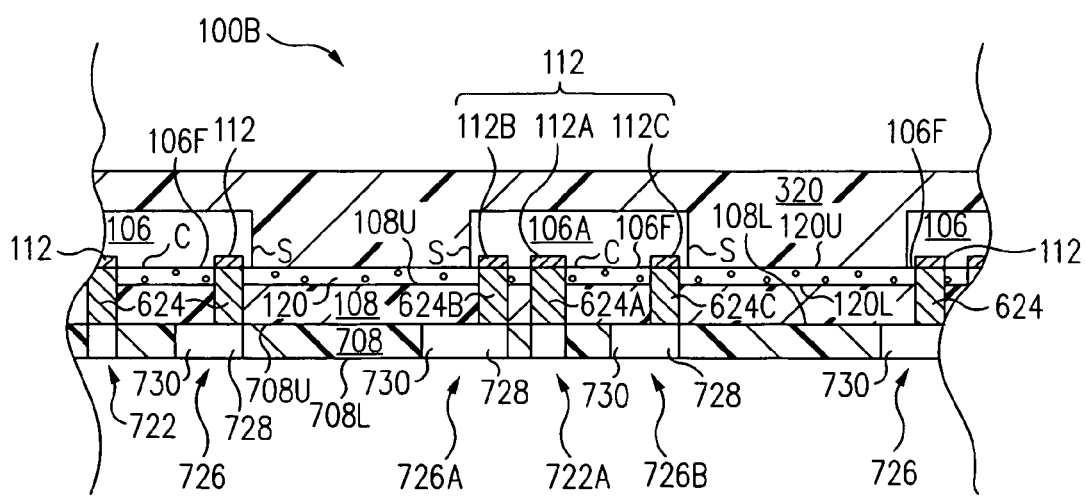

FIG. 7 is a cross-sectional view of assembly 100B of FIG. 6 at a further stage during the fabrication of a plurality of wafer level electronic component packages in accordance with one embodiment of the present invention. Referring now to FIG. 7, a second dielectric strip 708 is mounted to dielectric strip 108. More particularly, an upper, e.g., first, surface 708U of dielectric strip 708 is mounted to lower surface 108L of dielectric strip 108.

For example, dielectric strip 708 is mounted to dielectric strip 108 using a tack cure. More particularly, dielectric strip 708 is pressed on to dielectric strip 108. Assembly 100B is heated to fuse together and bond dielectric strip 708 to dielectric strip 108.

Illustratively, dielectric strip 108 and dielectric strip 708 are polytetrafluoroethylene (PTFE), liquid crystal polymer (LCP) or a non woven arimid although other low-K dielectric materials are used in other embodiments.

A plurality of via apertures 722 and trace channels 726 are formed using a laser, i.e., using laser ablation. Via apertures 722 and trace channels 726 extend through dielectric strip 708 and to vias 624. Via apertures 722 are sometimes called second via apertures.

In one embodiment, via apertures 722 are cylindrical in shape and extend vertically, i.e., in a first direction perpendicular to front surface 106F of electronic components 106, through dielectric strip 708 to vias 624. Trace channels 726 are trenches extending horizontally, i.e., in a second direction perpendicular to the first direction and parallel to front surface 106F of electronic components 106, from vias 624.

Vias 624 are exposed through via apertures 722 and trace channels 726. To illustrate, a first via aperture 722A of the plurality of via apertures 722 extends through dielectric strip 708 to via 624A.

To further illustrate, a first trace channel 726A of the plurality of trace channels 726 extends through dielectric strip 708 to via 624B. More particularly, via 624B is exposed at a first end 728 of trace channel 726A. Trace channel 726A extends horizontally outwards from a center C of electronic component 106 and outwards from via 624B to a second end 730 of trace channel 726A in a fan-out configuration.

To further illustrate, a second trace channel 726B of the plurality of trace channels 726 extends through dielectric strip 708 to via 624C. More particularly, via 624C is exposed at a first end 728 of trace channel 726B. Trace channel 726B extends horizontally inwards toward center C from via 624C to a second end 730 of trace channel 726B in a fan-in configuration.

In one embodiment, a laser is stepped and pulsed repeatedly to form via apertures 722 and trace channels 726. However, in another embodiment, a plurality of lasers is simultaneous pulsed to form some or all of via apertures 722 and trace channels 726 simultaneously. During formation of trace channels 726, the laser is moved during pulsing to form the horizontal trenches of trace channels 726.

By controlling the laser intensity and pulse time, via apertures 722 and trace channels 726 are all formed to have the same depth, this depth being equal to the thickness of dielectric strip 708. This simplifies and enhances reliability of filling, e.g., plating, of via apertures 722 and trace channels 726 with an electrically conductive material as discussed below.

Figure 8:
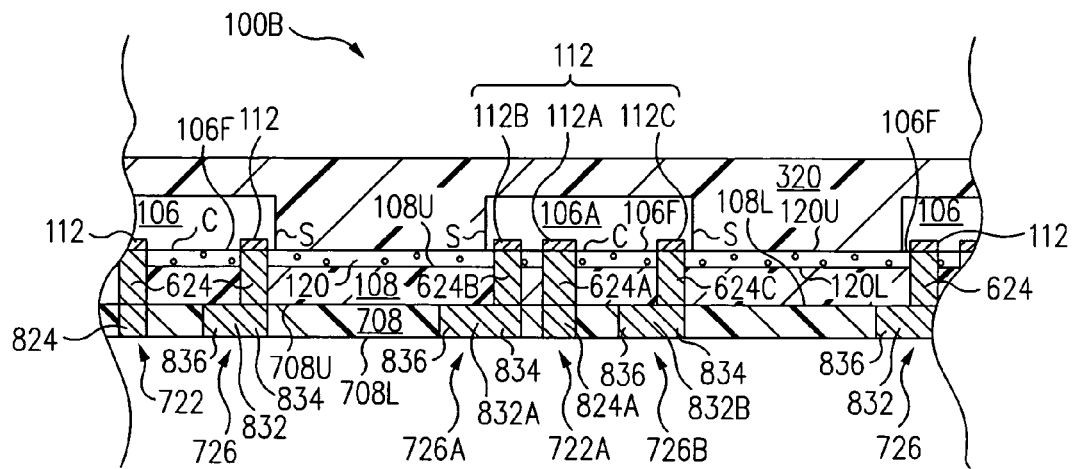

FIG. 8 is a cross-sectional view of assembly 100B of FIG. 7 at a further stage during the fabrication of a plurality of wafer level electronic component packages in accordance with one embodiment of the present invention. Referring now to FIGS. 7 and 8 together, via apertures 722 and trace channels 726 are filled with an electrically conductive material, e.g., a metal or metal containing material, an electrically conductive adhesive, or solder paste, to form electrically conductive vias 824 and electrically conductive traces 832, respectively. Vias 824 are sometimes called second vias.

In one embodiment, copper or a copper containing material is plated in via apertures 722 and trace channels 726 to form vias 824 and traces 832, respectively. In another embodiment, via apertures 722 and trace channels 726 are filled with an electrically conductive adhesive, which is cured if necessary, to form vias 824 and traces 832, respectively. In yet another embodiment, via apertures 722 and trace channels 726 are filled with a solder paste. Assembly 100B is then heated to reflow the solder paste to form vias 824 and traces 832, respectively.

Vias 824 form vertical electrical connectors, i.e., form electrical connectors extending vertically. Traces 832 form horizontal electrical connectors, i.e., form electrical connectors extending horizontally.

After formation of vias 824 and traces 832, any excess electrically conductive material formed on a lower, e.g., second, surface 708L of dielectric strip 708 is removed.

Illustratively, an etch or physical grinding process is used. In one embodiment, an over-etch process is used to slightly over-etch vias 824 and traces 832. This ensures that shorting between vias 824 and/or traces 832 from excess electrically conductive material is avoided.

Vias 824 and traces 832 are electrically connected to corresponding vias 624. To illustrate, a first via 824A of the plurality of vias 824 is electrically connected to via 624A. Vias 824 extend from vias 624, through dielectric strip 708 to be adjacent or recessed from lower surface 708L of dielectric strip 708.

To further illustrate, a first trace 832A of the plurality of traces 832 is electrically connected to via 624B. More particularly, a first end 834 of trace 832A is electrically connected to via 624B. Trace 832A extends horizontally outwards from a center C of electronic component 106 and outwards from via 624B to a second end 836 of trace 832A in a fan-out configuration.

To further illustrate, a second trace 832B of the plurality of traces 832 is electrically connected to via 624C. More particularly, a first end 834 of trace 832B is electrically connected to via 624C. Trace 832B extends horizontally inwards toward center C from via 624C to a second end 836 of trace 832B in a fan-in configuration.

Although a fan-out trace and a fan-in trace, i.e., traces 832A, 832B, respectively, are illustrated and discussed, in other embodiments, only fan-in traces or fan-out traces are formed.

After formation of vias 824 and traces 832, assembly 100B is inspected to insure that all via apertures 722 and trace channels 726 are properly filled with electrically conductive material, i.e., to inspect the integrity of vias 824 and traces 832.

In one embodiment, any defective or unformed vias 824 and traces 832 detected during the inspection are corrected, e.g., by etch removal of vias 824 and traces 832, reapplication of the electrically conductive material to reform vias 824 and traces 832, and removal of any excess electrically conductive material on lower surface 708L of dielectric strip 708. In this manner, the wafer level electronic component packages are fabricated with a maximum yield.

Figure 9:
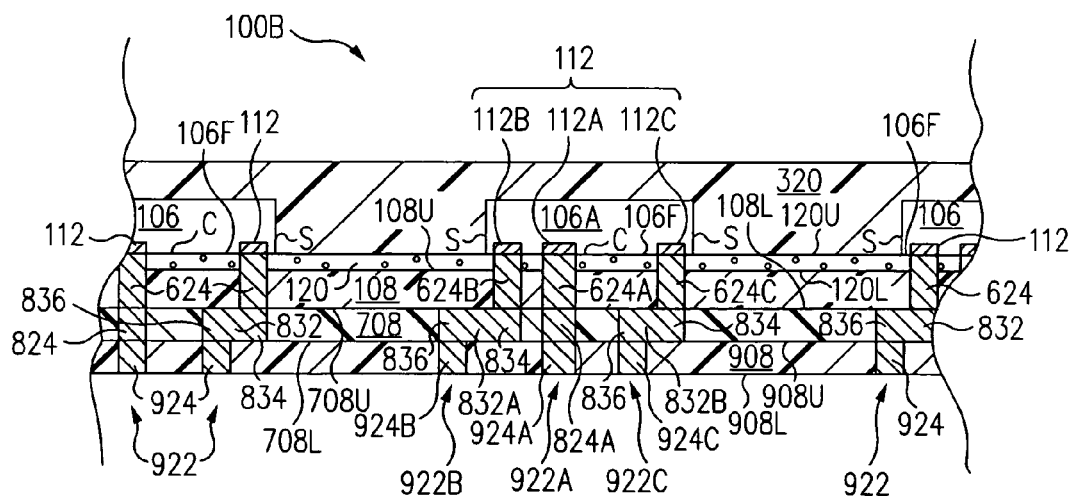

FIG. 9 is a cross-sectional view of assembly 100B of FIG. 8 at a further stage during the fabrication of a plurality of wafer level electronic component packages in accordance with one embodiment of the present invention. Referring now to FIG. 9, a third dielectric strip 908 is mounted to dielectric strip 708. More particularly, an upper, e.g., first, surface 908U of dielectric strip 908 is mounted to lower surface 708L of dielectric strip 708. Dielectric strip 908 is similar to dielectric strip 708 and mounted in a manner similar to that discussed above with regard to mounting of dielectric strip 708 to dielectric strip 108.

A plurality of via apertures 922 is formed using a laser, i.e., using laser ablation. Via apertures 922 extend through dielectric strip 908 to vias 824 and traces 832. In one embodiment, via apertures 922 are cylindrical in shape. Via apertures 922 are sometimes called third via apertures.

Vias 824 and second ends 836 of traces 832 are exposed through via apertures 922. To illustrate, via apertures 922A, 922B, 922C of the plurality of via apertures 922 extend through dielectric strip 908 to via 824A and second ends 836 of traces 832A, 832B, respectively.

Via apertures 922 are formed in a manner similar to via apertures 522 of FIG. 5 so formation of via apertures 922 is not discussed in detail to avoid detracting from the principles of the invention.

Via apertures 922 are filled with an electrically conductive material, e.g., a metal or metal containing material, an electrically conductive adhesive, or solder paste, to form electrically conductive vias 924. Via apertures 922 are filled to form vias 924 in a manner similar to that discussed with regard to vias 624 of FIG. 6 so formation of vias 924 is not discussed in detail to avoid detracting from the principles of the invention. Vias 924 are sometimes called third vias.

After formation of vias 924, any excess electrically conductive material formed on a lower, e.g., second, surface 908U of dielectric strip 908 is removed. Illustratively, an etch or physical grinding process is used. In one embodiment, an over-etch process is used to slightly over-etch vias 924. Thus, vias 924 remain recessed within via apertures 922. This ensures that shorting between vias 924 from excess electrically conductive material is avoided.

Vias 924 are electrically connected to corresponding vias 824 and second ends 836 of traces 832. To illustrate, vias 924A, 924B, 924C of the plurality of vias 924 are electrically connected to via 824A and second ends 836 of traces 832A, 832B, respectively. Vias 924 extend from vias 824 and second ends 836 of traces 832 through dielectric strip 908 to be adjacent or slightly recessed from lower surface 908L of dielectric strip 908.

In one embodiment, vias 924 are formed to have a larger diameter than the width of traces 832 and/or the diameter of vias 824. By forming vias 924 with the appropriate diameter, tolerance in the positioning of vias 924 is accommodated. Stated another way, by forming vias 924 with a sufficiently large diameter, electrical contact between vias 924 and vias 824/traces 832 is assured.

After formation of vias 924, assembly 100B is inspected to insure that all via apertures 922 are properly filled with electrically conductive material, i.e., to inspect the integrity of vias 924.

In one embodiment, any defective or unformed vias 924 detected during the inspection are corrected, e.g., by etch removal of vias 924, reapplication of the electrically conductive material to reform vias 924, and removal of any excess electrically conductive material on lower surface 908L of dielectric strip 908. In this manner, the wafer level electronic component packages are fabricated with a maximum yield.

Figure 10:
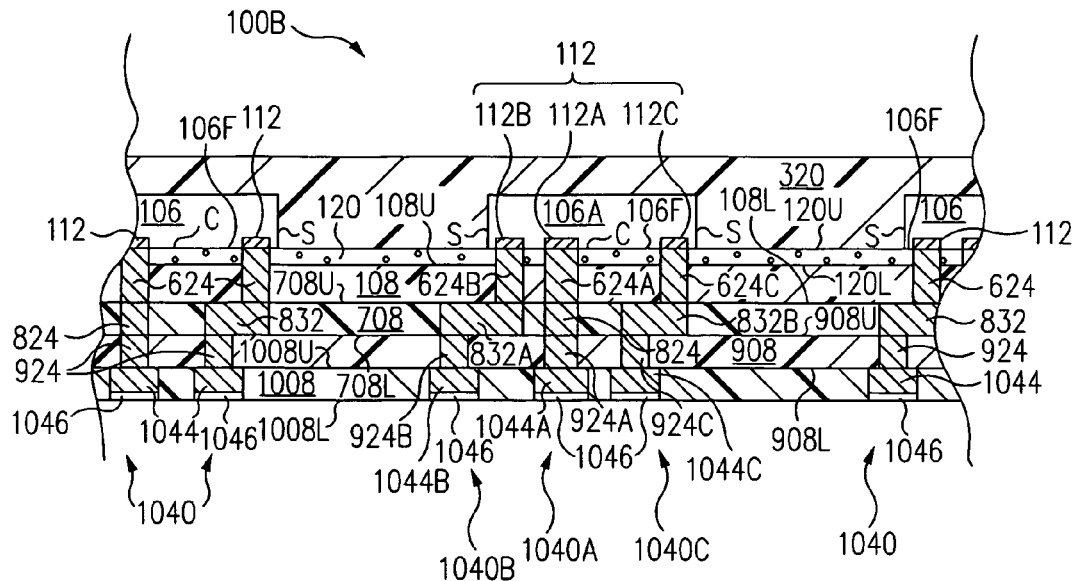

FIG. 10 is a cross-sectional view of assembly 100B of FIG. 9 at a further stage during the fabrication of a plurality of wafer level electronic component packages in accordance with one embodiment of the present invention. Referring now to FIG. 10, a fourth dielectric strip 1008 is mounted to dielectric strip 908. More particularly, an upper, e.g., first, surface 1008U of dielectric strip 1008 is mounted to lower surface 908L of dielectric strip 908. Dielectric strip 1008 is similar to dielectric strip 708 and mounted in a manner similar to that discussed above with regard to mounting of dielectric strip 708 to dielectric strip 108.

A plurality of land apertures 1040 is formed using a laser, i.e., using laser ablation. Land apertures 1040 extend through dielectric strip 1008 to vias 924. In one embodiment, land apertures 1040 are cylindrical in shape but can be patterned in a variety of shapes depending upon the particular interconnection structure used, e.g., interconnection balls or lands.

Vias 924 are exposed through land apertures 1040. To illustrate, land apertures 1040A, 1040B, 1040C of the plurality of land apertures 1040 extend through dielectric strip 1008 to vias 924A, 924B, and 924C, respectively.

Land apertures 1040 are formed in a manner similar to via apertures 522 of FIG. 5 so formation of land apertures 1040 is not discussed in detail to avoid detracting from the principles of the invention.

Land apertures 1040 are filled with an electrically conductive material, e.g., a metal or metal containing material, an electrically conductive adhesive, or solder paste, to form electrically conductive lands 1044. Land apertures 1040 are filled to form lands 1044 in a manner similar to that discussed with regard to vias 624 of FIG. 6 so formation of lands 1044 is not discussed in detail to avoid detracting from the principles of the invention.

After formation of lands 1044, any excess electrically conductive material formed on a lower, e.g., second, surface 1008L of dielectric strip 1008 is removed. Illustratively, an etch or physical grinding process is used.

In one embodiment, an over-etch process is used to slightly over-etch lands 1044. Thus, lands 1044 remain recessed within land apertures 1040. This ensures that shorting between lands 1044 from excess electrically conductive material is avoided.

Lands 1044 are electrically connected to corresponding vias 924. To illustrate, lands 1044A, 1044B, 1044C of the plurality of lands 1044 are electrically connected to vias 924A, 924B, and 924C, respectively. Lands 1044 extend from vias 924 through dielectric strip 1008 to be adjacent or slightly recessed from lower surface 1008L of dielectric strip 1008.

After formation of lands 1044, assembly 100B is inspected to insure that all land apertures 1040 are properly filled with electrically conductive material, i.e., to inspect the integrity of lands 1044. In one embodiment, any defective or unformed lands 1044 detected during the inspection are corrected, e.g., by etch removal of lands 1044, reapplication of the electrically conductive material to reform lands 1044, and removal of any excess electrically conductive material on lower surface 1008L of dielectric strip 1008. In this manner, the wafer level electronic component packages are fabricated with a maximum yield.

After formation of lands 1044, in one embodiment, a solder on paste (SOP) is applied to lands 1044. This solder on paste is reflowed, i.e., heated to a melt and cooled to resolidify, to form solder lands, which are represented as item 1046 in FIG. 10 in accordance with this embodiment.

In accordance with this embodiment, the resulting wafer level electronic component package is a land grid array package. The solder lands are used to electrically connect the wafer level electronic component package to the larger substrate, e.g., a mother or daughter board, for example, using a high lead solder such as a 90/10 lead/tin solder.

In another embodiment, a ball grid array package is formed. More particular, after formation of lands 1044, an organic solderability protectant (OSP), sometimes called an organic solderability preservative, is applied to lands 1044. The organic solderability protectant, which is represented as item 1046 in FIG. 10 in accordance with this embodiment, enhances the solder wet-ability of lands 1044. For simplicity of discussion, the organic solderability protectant is hereinafter referred to as OSP 1046. However, in another embodiment, OSP 1046 is not used.

Figure 11:
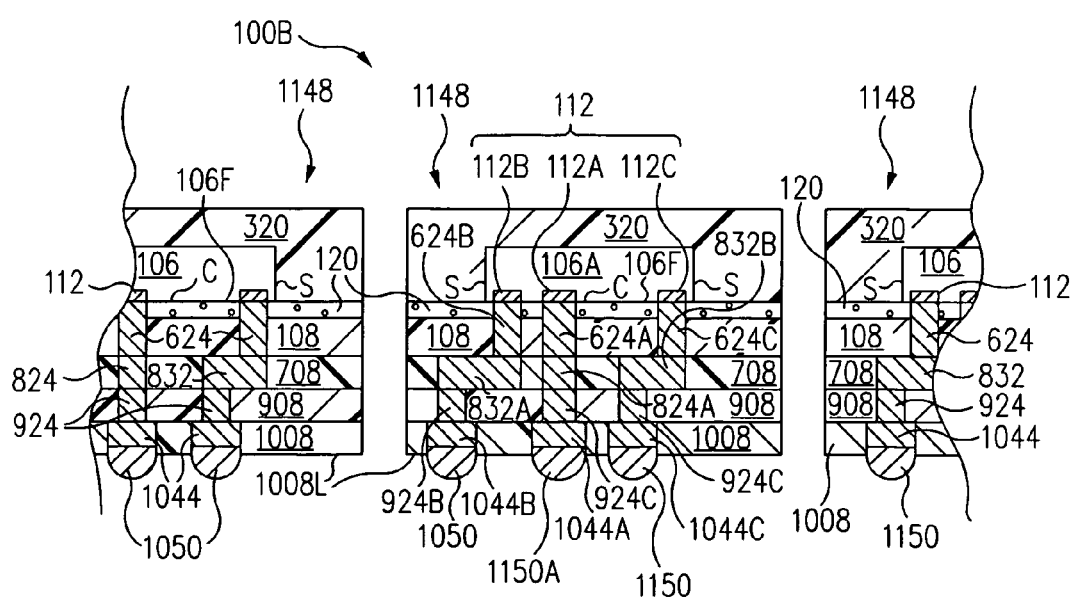

FIG. 11 is a cross-sectional view of assembly 100B of FIG. 10 at a further stage during the fabrication of a plurality of wafer level electronic component packages 1148 in accordance with one embodiment of the present invention. Referring now to FIG. 11, electrically conductive interconnection balls 1150, e.g., eutectic lead/tin solder, are formed on lands 1044. Interconnection balls 1150 are formed in a conventional manner. During formation of interconnection balls 1150, OSP 1046 is consumed.

Interconnection balls 1150 are used to electrically connect wafer level electronic component packages 1148 to the larger substrate, e.g., a mother or daughter board. Assembly 100B is then singulated, e.g., using a mechanical saw or laser, to form the plurality of wafer level electronic component packages 1148.

Each interconnection ball 1150 is electrically connected to a corresponding bond pad 112 as discussed above. In this manner, the pattern of bond pads 112 is redistributed to the pattern of interconnection balls 1150.

For example, bond pads 112 are formed on front surface 106F directly adjacent sides S of electronic components 106 in a typical wirebond configuration pattern. However, interconnection balls 1150 are distributed in an array pattern. Thus, the wirebond configuration pattern of bond pads 112 is redistributed to an array pattern of interconnection balls 1150. Although an array pattern of interconnection balls 1150 is discussed above, interconnection balls 1150 are distributed in any one of a number of desired patterns in other embodiments.

Further, interconnection balls 1150 are connected to bond pads 112 using a minimum path length. To illustrate, bond pad 112A is coupled to a first interconnection ball 1150A of the plurality of interconnection balls 1150 by vias 624A, 824A, 924A, land 1044A, which are directly aligned with one another. By using a minimum path length, heat transfer between bond pads 112 and more generally between electronic components 106 and interconnection balls 1150 is maximized thus improving the thermal performance of wafer level electronic component packages 1148. For similar reasons, impedance between bond pads 112 and interconnection balls 1150 is minimized.

As set forth above, (1) a dielectric strip is applied; (2) the dielectric strip is laser patterned to form via apertures and/or trace channels; (3) the via apertures and/or trace channels are filled with electrically conductive material to form vias and/or traces; (4) excess electrically conductive material is removed from lower surface of the dielectric strip; and (5) the formed vias and/or traces are inspected and corrected, if necessary. This process is repeated any number of desired times until the desired redistribution is achieved.

Further, since the via apertures 522, 722, 922 and/or trace channels 726 are formed with a laser in one embodiment, any changes in the design layout of the via apertures 522, 722, 922 and/or trace channels 726 are relatively simple to execute. More particularly, these design layout changes are made in the computer software, e.g., the CAD software, which drives the laser. Accordingly, the design layout changes are made with some relatively simple programming and executed immediately.

Referring still to FIG. 11, although four dielectric strips 108, 708, 908, 1008 are illustrated and discussed above, more or less than four dielectric strips are used in other embodiments. Generally, at least one dielectric strip, e.g., dielectric strip 108, is used.

Further, although vias 624, 824, 924, traces 832, and lands 1044 are discussed above as being formed in various dielectric strips 108, 708, 908, and 1008 for purposes of discussion, in light of this disclosure, those of skill in the art will understand that vias, traces, lands and/or combinations thereof can be formed in any single dielectric strip 108, 708, 908, or 1008.

Further, although vias 624, 824, 924, traces 832, and lands 1044 are discussed as distinct types of structures for purposes of discussion, in light of this disclosure, those of skill in the art will understand that vias 624, 824, 924, traces 832, and lands 1044 can be similar in structure. For example, a via or trace can form a land.

Still further, via apertures 522, 722, 922, trace channels 726 and land apertures 1040 are filled immediately after formation, i.e., before application of the next dielectric strip, with an electrically conductive material to form vias 624, 824, 924, traces 832 and lands 1044, respectively, in the discussion above. However, in an alternative embodiment, via apertures 522, 722, 922, trace channels 726 and land apertures 1040 are formed in some or all of dielectric strips 108, 708, 908, 1008. After formation, via apertures 522, 722, 922, trace channels 726 and land apertures 1040 are filled at the same time, e.g., in a single plating operation, with an electrically conductive material to form vias 624, 824, 924, traces 832 and lands 1044, respectively.

Figure 12:
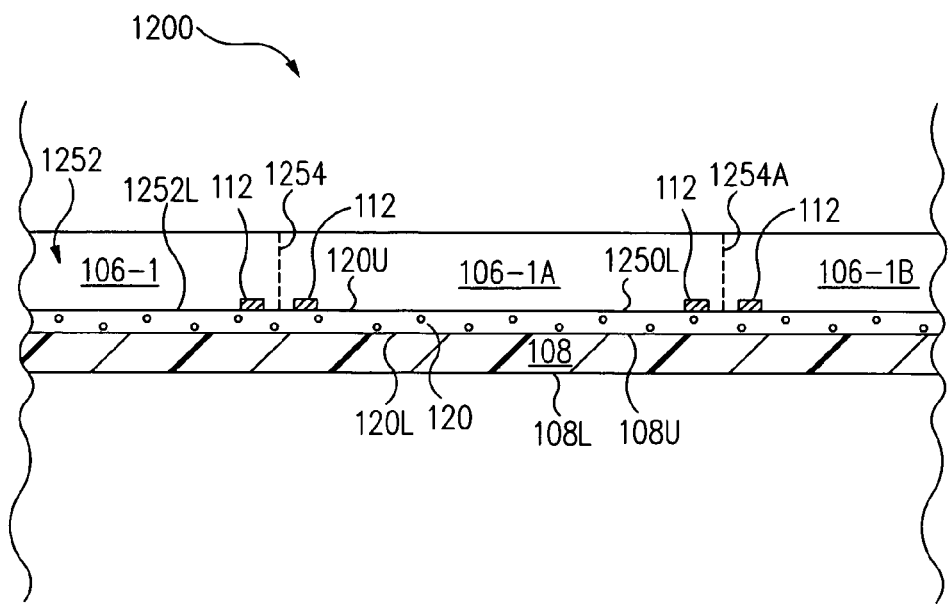
FIG. 12 is a cross-sectional view of an assembly during the fabrication of a plurality of wafer level electronic component packages in accordance with one embodiment of the present invention.

FIG. 12 is a cross-sectional view of an assembly 1200 during the fabrication of a plurality of wafer level electronic component packages in accordance with one embodiment of the present invention. Referring now to FIG. 12, assembly 1200 includes an electronic component substrate 1252 such as a silicon wafer. Electronic component substrate 1252 includes a plurality of electronic components 106-1 integrally connected together. Electronic components 106-1 include bond pads 112 on front surfaces 106F of electronic components 106-1, and more generally on a lower, e.g., first, surface 1252L of electronic component substrate 1252.

Electronic components 106-1 are integrally connected together in an array, e.g., a 2×2, 3×3 . . . or n×m array. Each of electronic components 106-1 is delineated by a singulation street 1254, which is located between adjacent electronic components 106-1. For example, a first singulation street 1254A of the plurality of singulation streets 1254 delineates a first electronic component 106-1A from a second electronic component 106-1B of the plurality of electronic components 106-1. The other electronic components 106-1 are similarly delineated from adjacent electronic components 106-1 by corresponding singulation streets 1254.

Upper surface 108U of dielectric strip 108 is mounted to front surfaces 106F of electronic components 106-1, and more generally to lower surface 1252L of electronic component substrate 1252 with adhesive strip 120. Electronic component substrate 1252 provides rigidity and support for assembly 1200.

Figure 13:
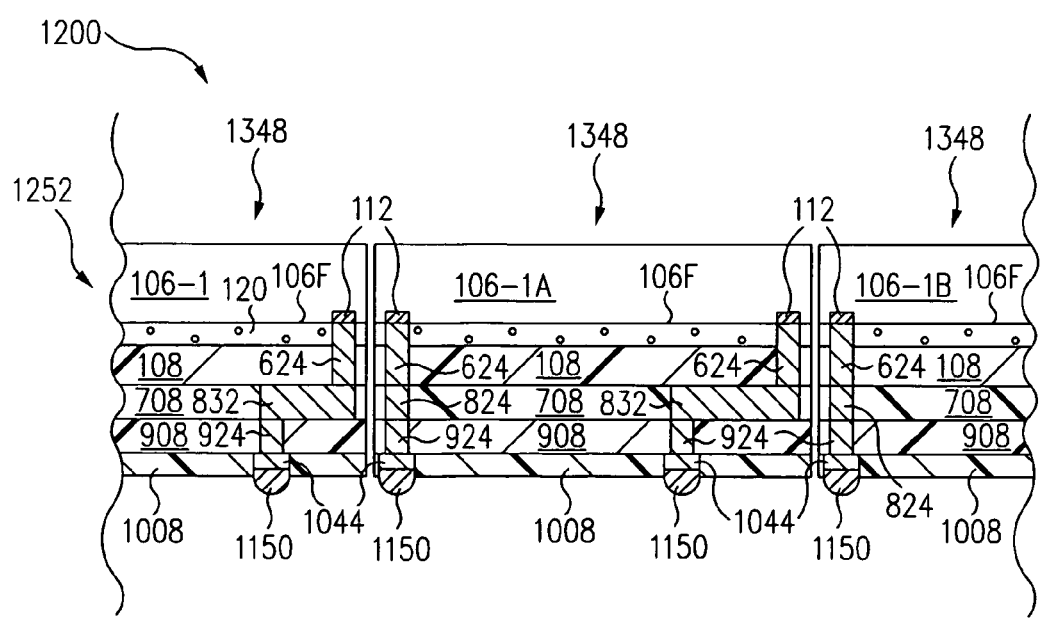
FIG. 13 is a cross-sectional view of the assembly of FIG. 12 at a further stage during the fabrication of a plurality of wafer level electronic component packages in accordance with one embodiment of the present invention.

FIG. 13 is a cross-sectional view of assembly 1200 of FIG. 12 at a further stage during the fabrication of a plurality of wafer level electronic component packages in accordance with one embodiment of the present invention. Referring now to FIG. 13, vias 624, 824, 924, traces 832, and lands 1044 are formed in dielectric strips 108, 708, 908, and 1008 as discussed above in reference to FIGS. 5, 6, 7, 8, 9, 10, and 11, the discussion of which is incorporated herein by reference in its entirety.

In the embodiment illustrated in FIG. 13, interconnection balls 1150 are formed on lands 1044 to form a ball grid array (BGA) package. Each interconnection ball 1150 is coupled to a corresponding bond pad 112. However, it is to be understood that a land grid array (LGA) package can also be fabricated.

Processing of assembly 1200 is a true wafer scale process. After formation of vias 624, 824, 924, traces 832, lands 1044 in dielectric strips 108, 708, 908, 1008, assembly 1200 is singulated along singulation streets 1254 (FIG. 12) resulting in the fabrication of wafer level electronic component packages 1348. Singulation is performed before or after fabrication of interconnection balls 1150.

Figure 14:
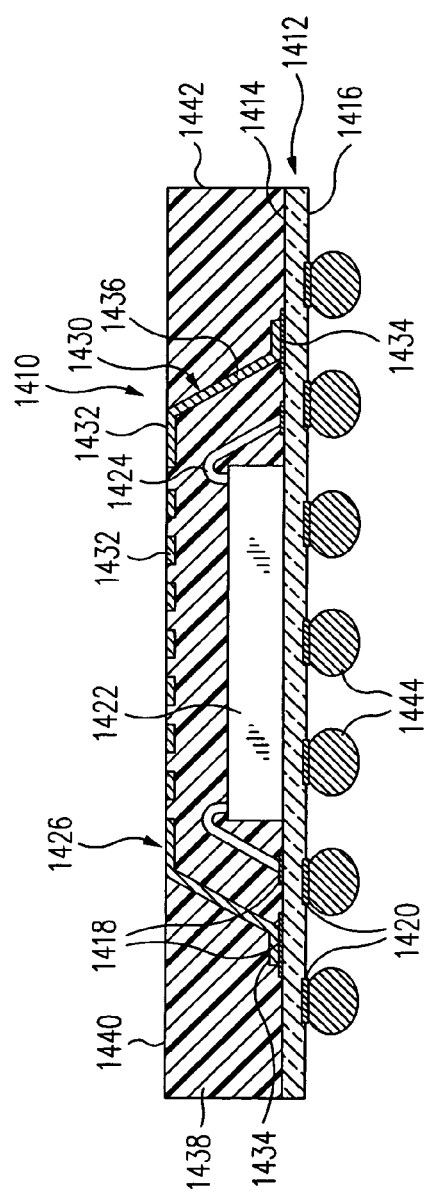
FIG. 14 is a cross-sectional view of a semiconductor package constructed in accordance with one embodiment of the present invention.
Figure 16:
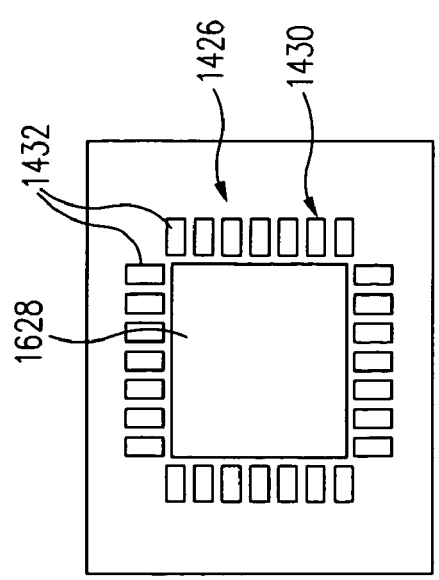
FIG. 16 is a top plan view of the semiconductor package constructed in accordance with either embodiments of the present invention as shown in FIGS. 14 and 15.

FIG. 14 illustrates an embedded leadframe BGA or LGA semiconductor package 1410 constructed in accordance with one embodiment of the present invention. FIG. 16 provides a top plan view of the completed package 1410 of the embodiment.

The electronic component package 1410 includes a laminate substrate 1412 which has a generally quadrangular (e.g., square, rectangular) configuration. The substrate 1412 defines a generally planar top surface 1414 and an opposed, generally planar bottom surface 1416. The substrate 1412 is formed to include a conductive pattern. The conductive pattern itself comprises a plurality of conductive pads 1418 of a first set which are coupled on the top surface 1414 in a prescribed pattern or array, and a plurality of conductive pads 1420 of a second set which is coupled on the bottom surface 1416 in a prescribed pattern or array. In addition to the pads 1418, 1420 of the first and second sets, the conductive pattern further includes conductive traces and/or vias which extend along and/or through the substrate 1412, and are arranged so as to place at least some of the conductive pads 1418 of the first set into electrical communication with at least one of the conductive pads 1420 of the second set. It will be recognized that one or more pads 1418 of the first set may be electrically isolated from the pads 1420 of the second set, and used solely for communicating with a semiconductor package which is stacked upon the electronic component package 1410.

The electronic component package 1410 of one embodiment further comprises a semiconductor die 1422, the bottom surface of which is directly mounted to the top surface 1414 of the substrate 1412. Such attachment is be facilitated through the use of a suitable epoxy or adhesive. The terminals of the semiconductor die 1422 are electrically connected to respective ones of the pads 1418 of the first set through the use of conductive wires 1424.

As further seen in FIG. 14, the electronic component package 1410 of one embodiment also includes a leadframe 1426. The leadframe 1426 itself comprises a central support plate 1628 (shown in FIG. 16) which has a generally quadrangular (e.g., square) configuration. In addition to the support plate 1628, the leadframe 1426 comprises a plurality of elongate leads 1430 which are arranged about the support plate 1628 in spaced relation to the peripheral edge thereof. In the leadframe 1426, each of the leads 1430 has a bent configuration so as to define an upper terminal portion 1432 and a lower mounting portion 1434, lower mounting portion 1434 sometimes called mounting portion. As best seen in FIG. 14, the terminal and mounting portions 1432, 1434 of each lead 1430 extend angularly relative to a central portion 1436 thereof. In the electronic component package 1410, the leadframe 1426 is electrically connected to the conductive pattern of the substrate 1412 by placing the mounting portions 1434 of the leads 1430 into direct, conductive contact with respective ones of the pads 1418 of the first set. Due to the bent configuration of each of the leads 1430, the electrical connection of the mounting portions 1434 to the pads 1418 results in the terminal portions 1432 of the leads 1430 being elevated substantially above the top surface 1414 of the substrate 1412, and extending in generally parallel relation thereto. The support plate 1628 of the leadframe 1426 is also elevated above and extends in generally parallel relation to the top surface 1414, for reasons which will be described in more detail below. As best seen in FIG. 16, the configuration of the leadframe 1426 is such that the terminal portions 1432 thereof are arranged in a generally quadrangular pattern when the leadframe 1426 is electrically connected to the conductive pattern of the substrate 1412 in the above-described manner. In addition to the terminal portions 1432 of the leads 1430 being spaced from each other, they also extend along and in spaced relation to a respective one of the four peripheral edge segments defined by the quadrangular support plate 1628 of the leadframe 1426.

The electronic component package 1410 of one embodiment further comprises a package body 1438, sometimes called an electronic component package body, which is formed on the top surface 1414 of the substrate 1412. The electronic component package body 1438 is fabricated from an encapsulant material. The encapsulant material is preferably a plastic (e.g., thermoset, thermoplastic) which, upon hardening, forms the electronic component package body 1438. Such formation is itself preferably completed through the implementation of a molding process. The fully formed package body 1438 defines a generally planar top surface 1440 and a generally planar side surface 1442 which extends generally perpendicularly from the top surface 1440 is substantially flush or continuous with the peripheral edge of the substrate 1412. As indicated above, the bottom surface of the electronic component package body 1438 rests directly against the top surface 1414 of the substrate 1412. However, it is contemplated that the electronic component package body 1438 may be formed so as not to extend all the way to the peripheral edge of the substrate 1412.

In the electronic component package 1410, the electronic component package body 1438 is formed such that both the semiconductor die 1422 and conductive wires 1424 used to electrically connect the semiconductor die 1422 to the conductive pattern of the substrate 1412 are fully covered or encapsulated by the electronic component package body 1438. The leadframe 1426 of the electronic component package 1410 is itself partially covered or encapsulated by the electronic component package body 1438. In this regard, though both the mounting and central portions 1434, 1436 of each lead 1430 of the leadframe 1426 are covered by the electronic component package body 1438, the terminal portion 1432 of each lead 1430 is partially exposed therein. More particularly, one surface of each terminal portion 1432 is exposed in and substantially flush with the top surface 1440 of the electronic component package body 1438. Those of ordinary skill in the art will recognize that as an alternative to one surface of each terminal portion 1432 being exposed in and substantially flush with the top surface 1440 of the electronic component package body 1438, each terminal portion 1432 may slightly protrude from the top surface 1440.

Figure 22:
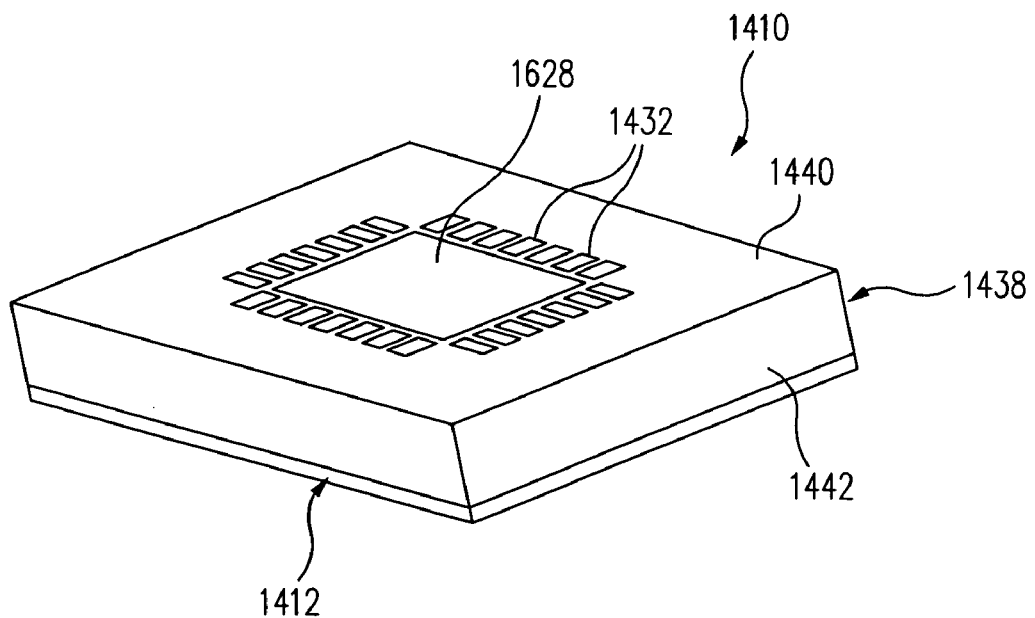

As further seen in FIG. 16 and in FIG. 22, also exposed in the electronic component package body 1438 is one surface of the support plate 1628 of the leadframe 1426. More particularly, one surface of the support plate 1628 is exposed in and substantially flush with the top surface 1440 of the electronic component package body 1438, in the same manner one surface of each terminal portion 1432 is exposed in and substantially flush with the top surface 1440. Thus, the exposed surfaces of the terminal portions 1432 and the support plate 1628 preferably extend in generally co-planar relation to each other. However, as described above in relation to the terminal portions 1432, the support plate 1628 may protrude slightly from the top surface 1440 of the electronic component package body 1438. As seen in FIG. 16 and as described above, the exposed surfaces of the terminal portions 1432, in addition to being spaced from each other, also extend along and in spaced relation to a respective ones of the four peripheral edge segments defined by the exposed surface of the support plate 1628. The leadframe 1426 is preferably fabricated from a conductive metal material, such as copper.

The electronic component package 1410 of one embodiment further comprises a plurality of solder balls 1444 which are formed on and conductively connected to respective ones of the pads 1420 of the second set in the manner shown in FIG. 1. The solder balls 1444 are used to electrically connect the electronic component package 1410 to an external device such as a printed circuit board (PCB).

Figure 23:
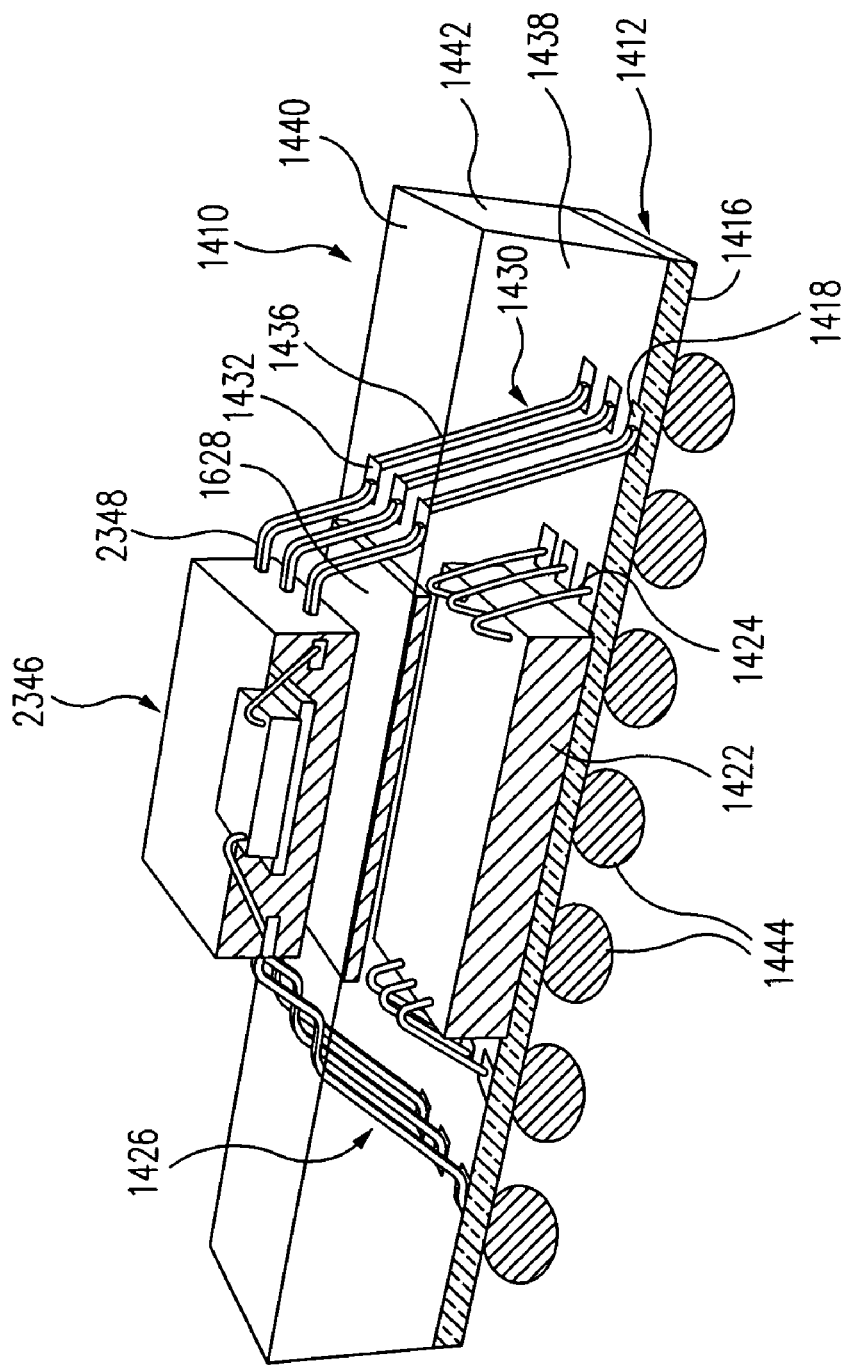
FIG. 23 is a partial cross-sectional view illustrating a manner in which a second semiconductor package is stacked upon the semiconductor package constructed in accordance with one embodiment of the present invention.

Referring now to FIG. 23 in the completed package 1410, the exposed surfaces of the terminals 1432 of the leads 1430 of the leadframe 1426 define a "footprint" which allows for the stacking of a second semiconductor package 2346 upon the electronic component package 1410, and electrical connection of the second semiconductor package 2346 to the electronic component package 1410. In this regard, such electrical connection is preferably facilitated by placing the leads 2348 of the second semiconductor package 2346 into electrical connection to respective ones of the exposed surfaces of the terminal portions 1432 of the leadframe 1426 of the electronic component package body 1410.

Figure 17:
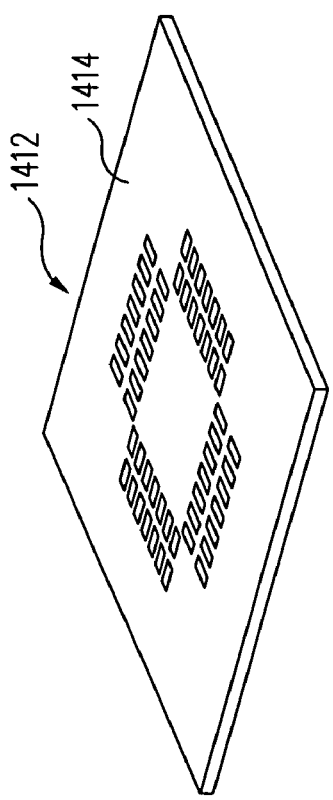
FIGS. 17, 18, 19, 20, 21, and 22 illustrate an exemplary sequence used to facilitate the fabrication of the semiconductor package constructed in accordance with one embodiment of the present invention shown in FIG. 14.

Having thus described the structural attributes of the electronic component package 1410 of one embodiment, an exemplary method of fabricating the same will now be described with regard to FIGS. 17, 18, 19, 20, 21, and 22. In the initial step of the fabrication methodology, the substrate 1412 is provided (FIG. 17). As indicated above, the substrate 1412, as fabricated, includes the above-described conductive pattern which comprises the conductive pads 1418, 1420 of the first and second sets and the intervening traces and/or vias.

Figure 18:
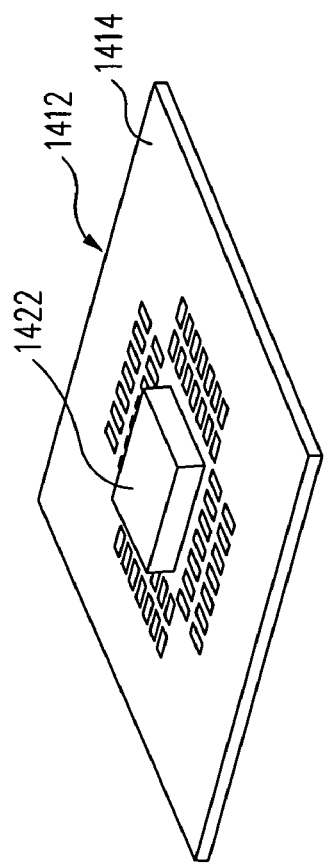
Figure 19:
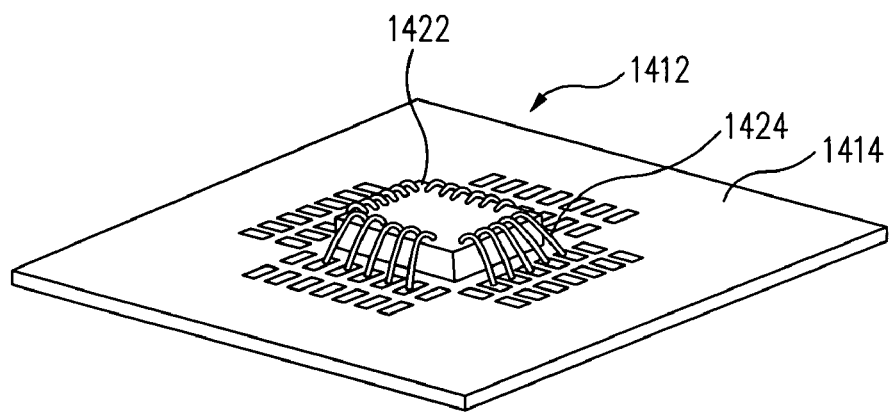
Figure 20:
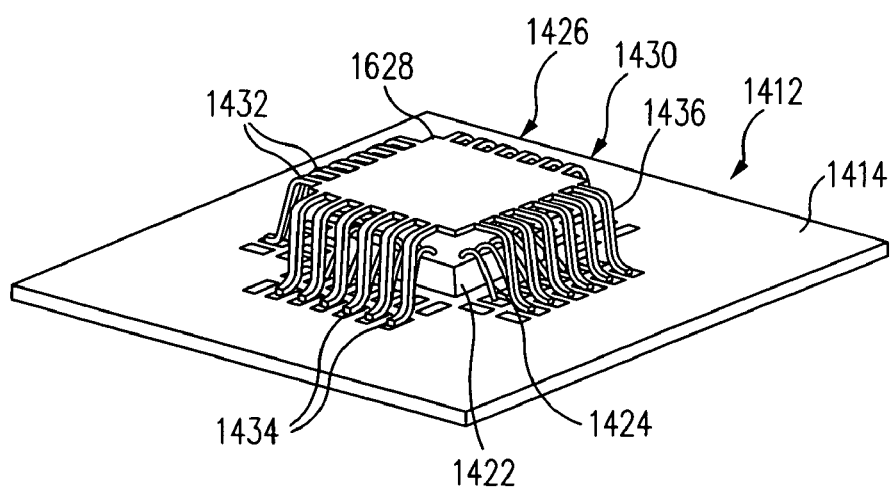

In the next step of the fabrication process, the semiconductor die 1422 is attached to the top surface 1414 of the substrate 1412 in the above-described manner (FIG. 18). Thereafter, the terminals coupled on the top surface of the semiconductor die 1422 are electrically connected to respective ones of the pads 1418 of the first set through the use of the conductive wires 1424 (FIG. 19). Subsequent to the electrical connection of the semiconductor die 1422 to the conductive pattern of the substrate 1412 through the use of the conductive wires 1424, the leadframe 1426 is itself electrically connected to the conductive pattern of the substrate 1412 in the above-described manner (FIG. 20). More particularly, the mounting portions 1434 of the leads 1430 of the leadframe 1426 are electrically connected to respective ones of the pads 1418 of the first set. As is noted in FIG. 20, when the leadframe 1426 is initially electrically connected to the substrate 1412, each of the leads 1430 is integrally connected to the support plate 1628. In this regard, the leads 1430 are segregated into four sets, with the terminal portions 1432 of the leads 1430 of each set being integrally connected to a respective one of the four peripheral edge segments defined by the support plate 1628. When the leadframe 1426 is in its original state (not shown), the leads 1430 are not bent, and thus extend generally perpendicularly from respective ones of the peripheral edge segments of the support plate 1628. In this regard, the bending of the leads 1430 to cause the same to assume the above-described shape typically occurs subsequent to the initial formation of the support plate 1628 and leads 1430. When the leadframe 1426 is attached to the substrate 1412 in the above-described manner, the semiconductor die 1422 resides between the substrate 1412 and the support plate 1628 of the leadframe 1426.

Figure 21:
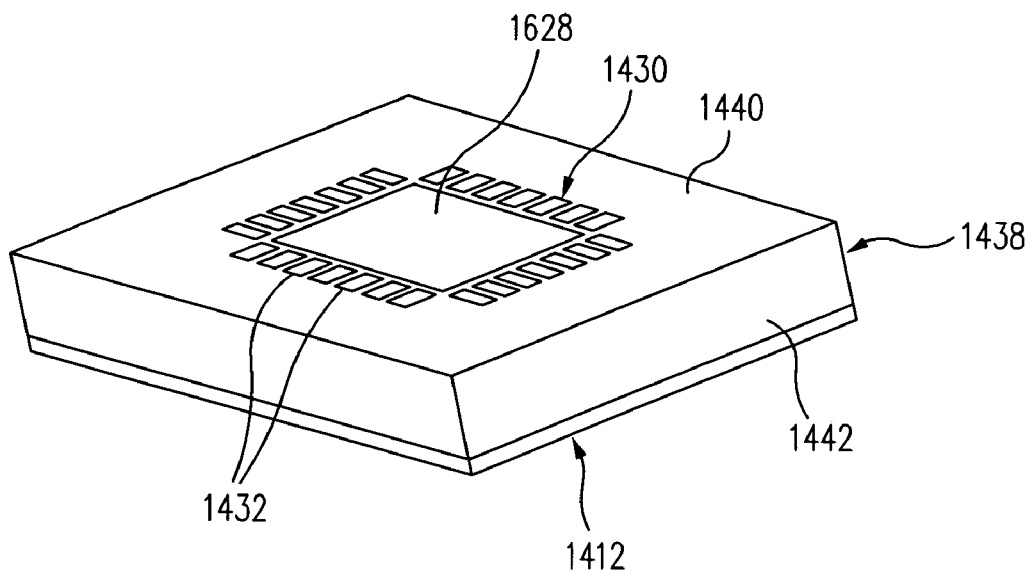

Subsequent to the electrical connection of the leadframe 1426 to the substrate 1412, a molding process is completed to facilitate the formation of the electronic component package body 1438 (FIG. 21). As described above, the electronic component package body 1438 is preferably formed such that one surface of the support plate 1628 and one surface of the terminal portion 1432 of each of the leads 1430 is exposed in and substantially flush with top surface 1440 of the electronic component package body 1438. Typically, in order to facilitate the exposure of such surfaces of the support plate 1628 and terminal portions 1432, a de-flashing process is completed subsequent to the initial formation of the electronic component package body 1438. Upon the completion of such de-flashing process, the exposed surfaces of the terminal portions 1432 of the leads 1430 may optionally be plated with a layer of a suitable conductive material.

In the final step of the fabrication method for the semiconductor package 1410, a singulation process is completed to effectively electrically isolate the terminal portions 1432 of the leads 1430 from the support plate 1628 and each other (FIG. 22). Such singulation may be completed through either a chemical etching, sawing, or laser singulation process. In the sawing process, a pattern of cuts is made within the top surface 1440 of the electronic component package body as needed to completely sever the terminal portions 1432 of the leads 1430 from the support plate 1628. Similarly, in the etching process, the exposed surfaces of the leadframe 1426 are initially masked such that the chemical etchant thereafter applied thereto removes only enough metal of the leadframe 1426 as is necessary to completely sever the terminal portions 1432 of the leads 1430 from the support plate 1628. The completion of the sawing or etching process described above completes the fabrication of the electronic component package 1410.

Figure 15:
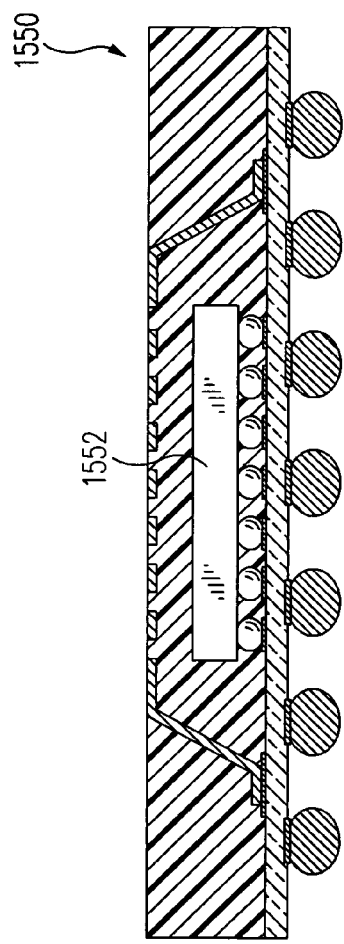
FIG. 15 is a cross-sectional view of a semiconductor package constructed in accordance with one embodiment of the present invention.

Referring now to FIG. 15, there is shown an embedded leadframe package 1550 constructed in accordance with another embodiment of the present invention. The electronic component package 1550 is substantially similar in construction to the electronic component package 1410 of the other embodiment, the primary distinction being that the electronic component package 1550 includes a flip-chip semiconductor die 1552 as an alternative to the semiconductor die 1422 described above in relation to the electronic component package 1410. In this regard, the contacts or terminals of the flip-chip semiconductor die 1552 are electrically connected to respective ones of the pads 1418 of the first set. As will be recognized, the number of pads 1418 of the first set included on the substrate 1412 used in the electronic component package 1550 may exceed the number of pads 1418 included on the substrate 1412 used in the electronic component package 1410. In this regard, the increased number of pads 1418 in the electronic component package 1550 may be needed to accommodate the terminals 1554 of the flip-chip semiconductor die 1552. Thus, the electronic component package 1550 avoids the use of the above-described conductive wires 1424 due to the electrical connection between the flip-chip semiconductor die 1552 and conductive pattern of the substrate 1412 being facilitated by the contact between the terminals 1554 and the pads 1418. The fabrication methodology employed for the electronic component package 1550 is also substantially similar to that described above in relation to the electronic component package 1410, the distinction lying in the manner in which the flip-chip semiconductor die 1552 is electrically connected to the substrate 1412 in comparison to the manner in which the semiconductor die 1422 is electrically connected to the substrate 1412.

Figure 24:
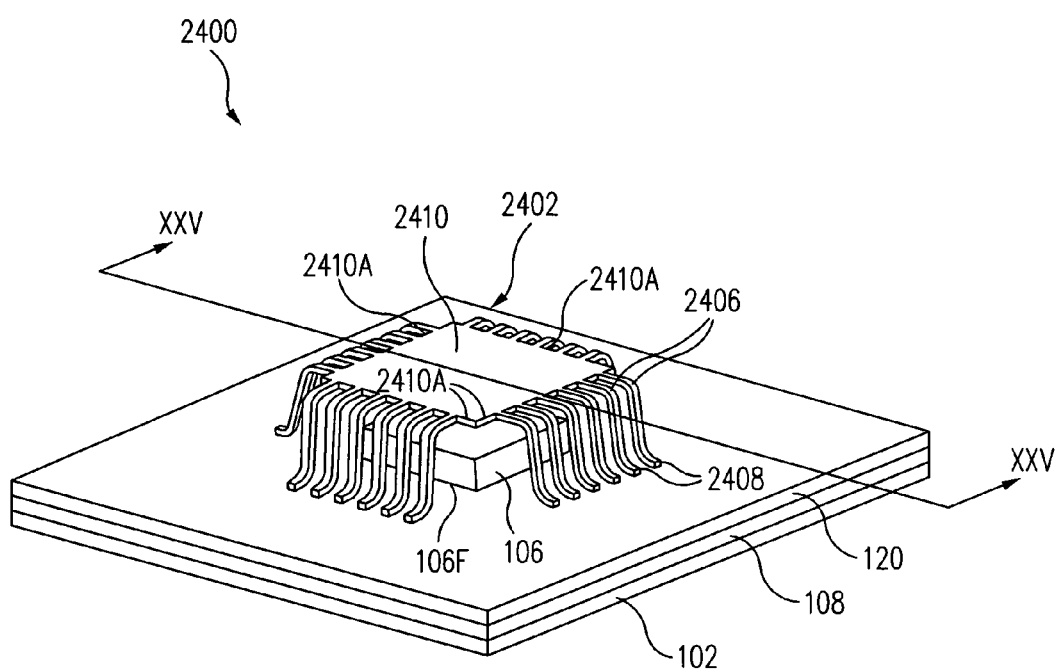
FIG. 24 is a perspective view of an assembly during the fabrication of a stackable embedded leadframe package in accordance with one embodiment of the present invention.

FIG. 24 is a perspective view of an assembly 2400 in accordance with one embodiment of the present invention.

FIG. 25 is a cross-sectional view of assembly 2400 of FIG. 24, along cut line XXV-XXV, in accordance with one embodiment of the present invention.

Assembly 2400, sometimes called a first electronic component package or stackable embedded leadframe package, is similar to assembly 100B of FIG. 1B and only significant differences are discussed below. Similar reference numbers are used to represent similar elements.

Referring now to FIGS. 24 and 25 together, assembly 2400, sometimes called a first assembly, includes a rigid support strip 102, e.g., an aluminum, copper, or stainless steel plate. Support strip 102 includes fiducials 104 on an upper, e.g., first, surface 102U of support strip 102. Fiducials 104 are used for alignment and mounting of an electronic component 106, as previously discussed. Electronic component 106 is sometimes called a first electronic component.

A dielectric strip 108, sometimes called first dielectric strip 108, is mounted to support strip 102. In one embodiment, a lower, e.g., second, surface 108L of dielectric strip 108 is mounted to upper surface 102U of support strip 102. For example, dielectric strip 108 is tacky, sometimes called sticky, and is simply pressed against support strip 102 to mount dielectric strip 108 to support strip 102.

An adhesive strip 120 is used to mount electronic component 106 to dielectric strip 108. More particularly, a lower, e.g., first, surface 120L of adhesive strip 120 is mounted to an upper, e.g., first, surface 108U of dielectric strip 108. A front, e.g., first, surface 106F of electronic component 106 is mounted to an upper, e.g., second, surface 120U of adhesive strip 120.

In various embodiments, adhesive strip 120 is an electrical insulator. Illustratively, adhesive strip 120 is a liquid adhesive, for example, applied by spin coating. As another example, adhesive strip 120 is a double-sided sticky tape although other adhesives are used in other embodiments. Although use of adhesive strip 120 is illustrated in the figures which follow and is discussed below for purposes of simplicity, it is to be understood that various adhesives are used instead of adhesive strip 120 in alternative embodiments, such as first adhesive 110A of FIG. 1A.

Formed on front surface 106F of electronic component 106 are bond pads 112, e.g., formed of aluminum. Bond pads 112, such as bond pads 112A, 112B, and 112C, are connected to internal circuitry of electronic component 106.

A leadframe 2402, sometimes called a first leadframe, is mounted to adhesive strip 120. Leadframe 2402 can be spaced apart from or connected to electronic component 106, as illustrated.

More particularly, a lower, e.g., first, surface 2410L of a support plate 2410 of leadframe 2402 is mounted to a rear, e.g., second, surface, 106R of electronic component 106. To illustrate, second adhesive 218B mounts lower surface 2410L of support plate 2410, sometimes called a first support plate, to rear surface 106R of electronic component 106. Lower mounting portions 2408, sometimes called first lower mounting portions, of leads 2404 of leadframe 2402 adhere to adhesive strip 120. Leads 2404 are sometimes called first leads and terminal portions 2408 of leads 2404 are sometimes called first terminal portions.

To illustrate, a lower, e.g., first, surface 2408L of a lower mounting portion 2408D of a lead 2404A of leads 2404 adheres to upper surface 120U of adhesive strip 120.

Figure 26:
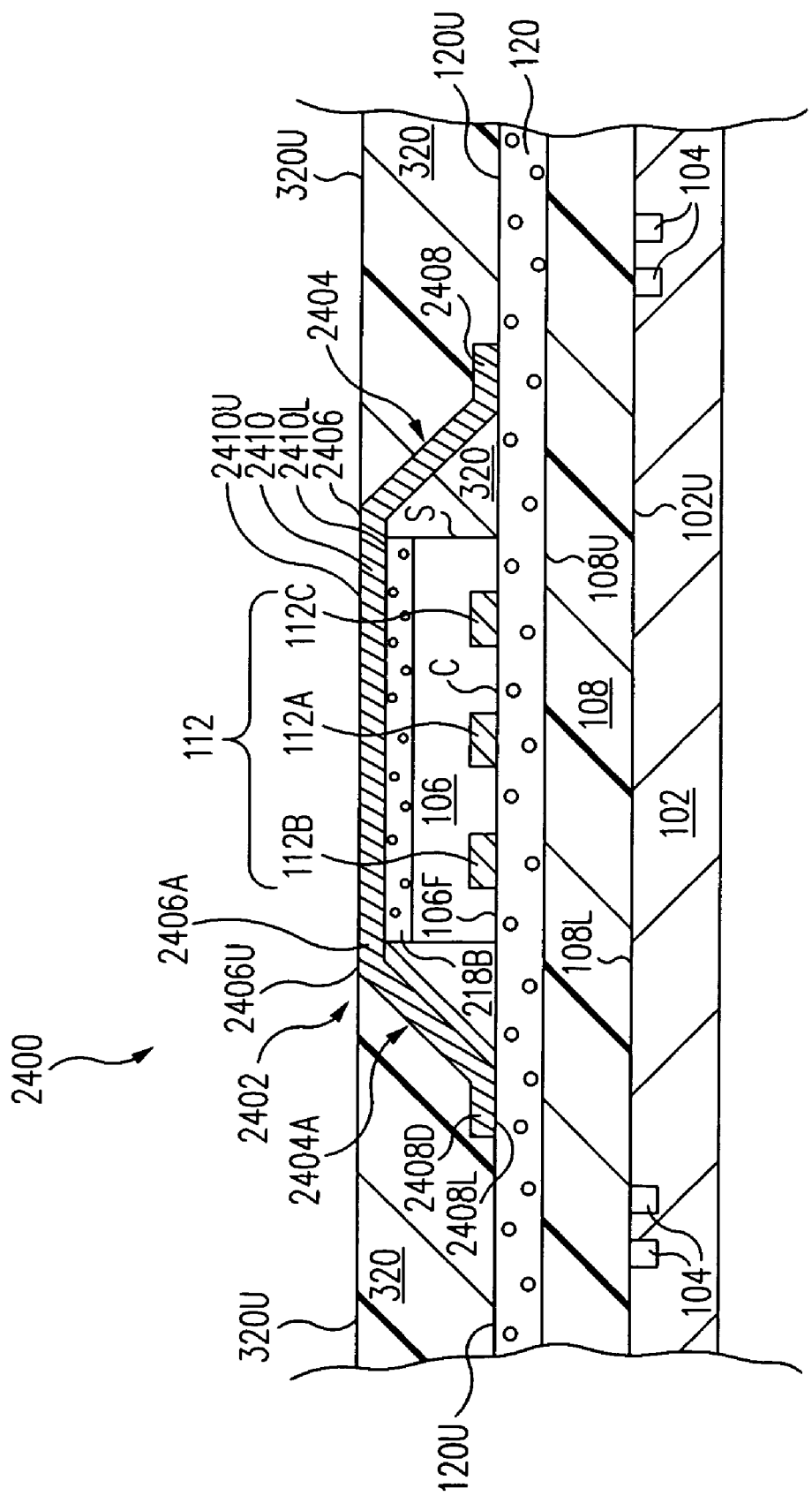
FIGS. 26, 27, 28, 29, 30, 31, 32, 33 and 34 are cross-sectional views of the assembly of FIG. 25 at further stages during the fabrication of the stackable embedded leadframe package in accordance with one embodiment of the present invention.
Figure 27:
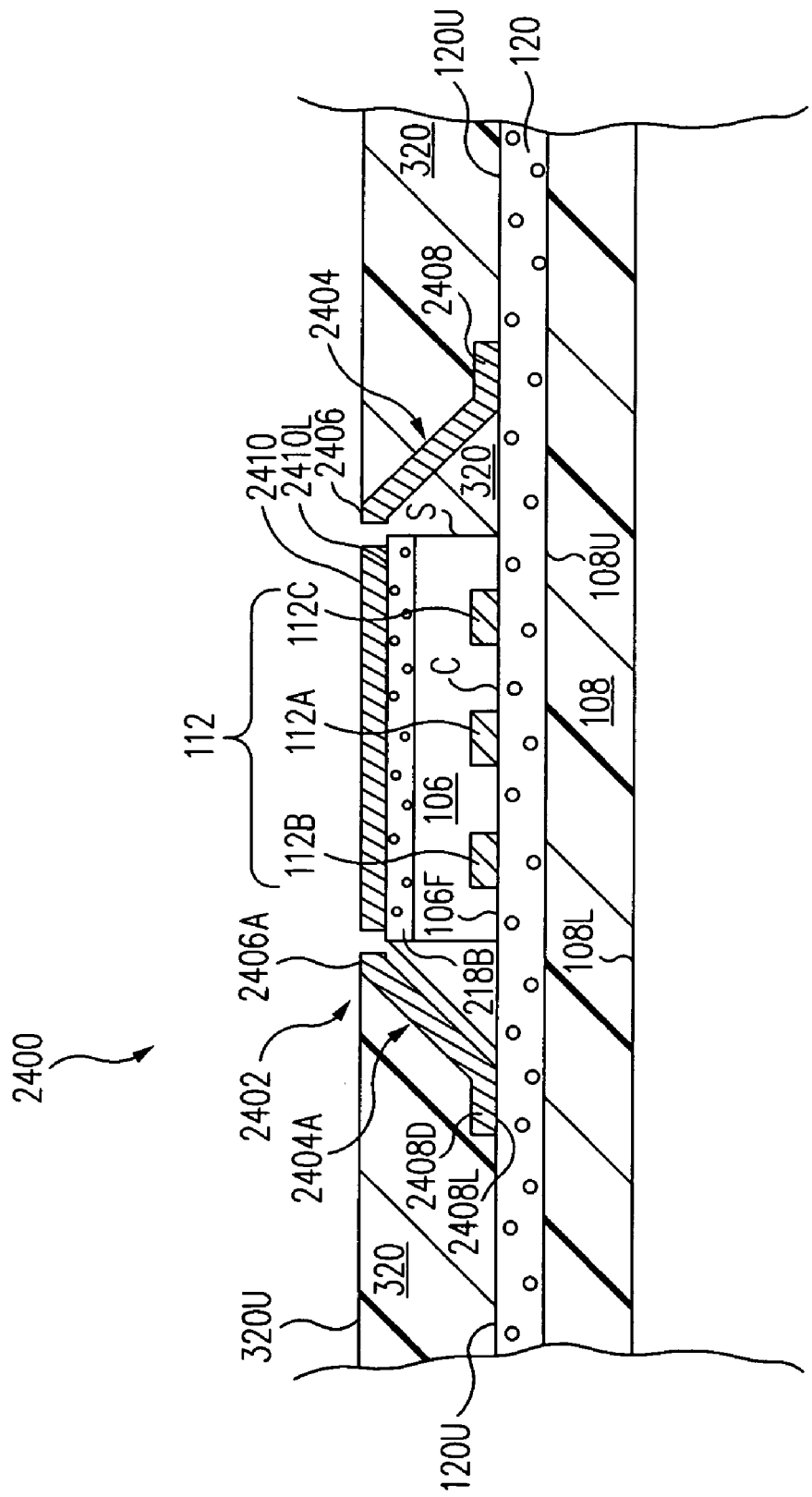

FIG. 26 is a cross-sectional view of assembly 2400 of FIG. 25 at a further stage during fabrication of the stackable embedded leadframe package in accordance with one embodiment of the present invention. Assembly 2400 of FIG. 26 is similar to assembly 100B of FIG. 3 and only the significant differences are discussed below.

Referring now to FIG. 26, electronic component 106 is encapsulated, sometimes called overmolded, in an encapsulant 320, forming an electronic component package body 320 sometimes called a package body. Encapsulant 320 protects electronic component 106 from the ambient environment.

Illustratively, a liquid encapsulant is applied and cured to form encapsulant 320. In another embodiment, a plastic encapsulant is applied, e.g., using a transfer or injection mold process, to form encapsulant 320.

Leadframe 2402 of assembly 2400 is partially covered or encapsulated by encapsulant 320. In this regard, though lower mounting portion 2408 of each lead 2404 in the plurality of leads 2404 is covered by encapsulant 320, terminal portion 2406 of each lead 2404 in the plurality of leads 2404 is partially exposed therein.

More particularly, an upper, e.g., first, surface 2406U of terminal portion 2406 of each lead 2404 in the plurality of leads 2404 is exposed in and substantially flush with a principal, e.g., first, surface 320U of package body 320. One skilled in the art will note that as an alternative to one surface 2406U of terminal portion 2406 of each lead 2404 in the plurality of leads 2404 being exposed in and substantially flush with principal surface 320U of package body 320, terminal portion 2406 of each lead 2404 in plurality of leads 2404 slightly protrudes from principal surface 320U of package body 320.

In one embodiment, an upper, e.g., a first, surface 2410U of support plate 2410 of leadframe 2402 is exposed in assembly 2400. More particularly, upper surface 2410U of support plate 2410 is exposed in and substantially flush with principal surface 320U of package body 320 in the same manner as upper surface 2406U of terminal portion 2406 of each lead 2404 in the plurality of leads 2404 is exposed and substantially flush with principal surface 320U of package body 320. Thus, exposed upper surface 2406U of terminal portion 2406 of each lead 2404 in the plurality of leads 2404 and exposed upper surface 2410U of support plate 2410 generally lie in co-planar relation to each other, i.e., in a common plane.

In one embodiment, however, and as described above in relation to terminal portions 2406 of leads 2404, support plate 2410 protrudes slightly from principal surface 320U of package body 320. To illustrate, upper surface 2410U of support plate 2410 protrudes slightly from principal surface 320U of package body 320.

The exposed upper surfaces 2406U of terminal portions 2406, in addition to being spaced from each other as previously described, also extend along and in spaced relation to a respective one of four peripheral edge segments 2410A (shown in FIG. 24) defined by exposed upper surface 2410U of support plate 2410. Leadframe 2402 is preferably fabricated from a conductive metal material, such as copper.

Typically, to facilitate the exposure of upper surface 2406U of terminal portion 2406 of each lead 2404 in the plurality of leads 2404 and of upper surface 2410U of support plate 2410, a de-flashing process is completed subsequent to the encapsulating process previously described. Upon the completion of such de-flashing process, exposed upper surface 2406U of terminal portion 2406 of each lead 2404 in the plurality of leads 2404 and upper surface 2410U of support plate 2410 are optionally plated with a layer of a suitable conductive material.

FIG. 27 is a cross-sectional view of assembly 2400 of FIG. 26 at a further stage during fabrication of stackable embedded leadframe package in accordance with one embodiment of the present invention. Assembly 2400 of FIG. 27 is similar to assembly 100B of FIG. 4 and only the significant differences are discussed below.

Referring now to FIG. 27, leads 2404 of leadframe 2402 are singulated in a singulation process and support strip 102 is removed.

A singulation process is completed to effectively electrically isolate terminal portion 2406 of each lead 2404 from support plate 2410 and from each other. To illustrate, the singulation process severs terminal portion 2406A of lead 2404A of leads 2404 from support plate 2410.

Such singulation is completed through either a chemical etching, sawing, or laser singulation process. In the sawing process, a pattern of cuts is made within assembly 2400 as needed to completely sever terminal portion 2406 of leads 2404 from support plate 2410.

Similarly, in the etching process, exposed surfaces of leadframe 2402 are initially masked such that a chemical etchant applied to the exposed surfaces removes only enough metal of leadframe 2402 as is necessary to completely sever terminal portion 2406 of each lead 2404 in the plurality of leads 2404 from support plate 2410.

Support strip 102 is removed from dielectric strip 108. In one embodiment, an upper surface 102U (shown in FIG. 26) of support strip 102 is pretreated, e.g., a release agent is applied, to facilitate easy removal of support strip 102. In one embodiment, support strip 102 is reusable and thus reused to fabricate another assembly.

Once support strip 102 is removed, encapsulant 320 provides rigidity and support for assembly 2400. Further, removal of support strip 102 exposes lower surface 108L of dielectric strip 108 for further processing as discussed further below.

Figure 28:
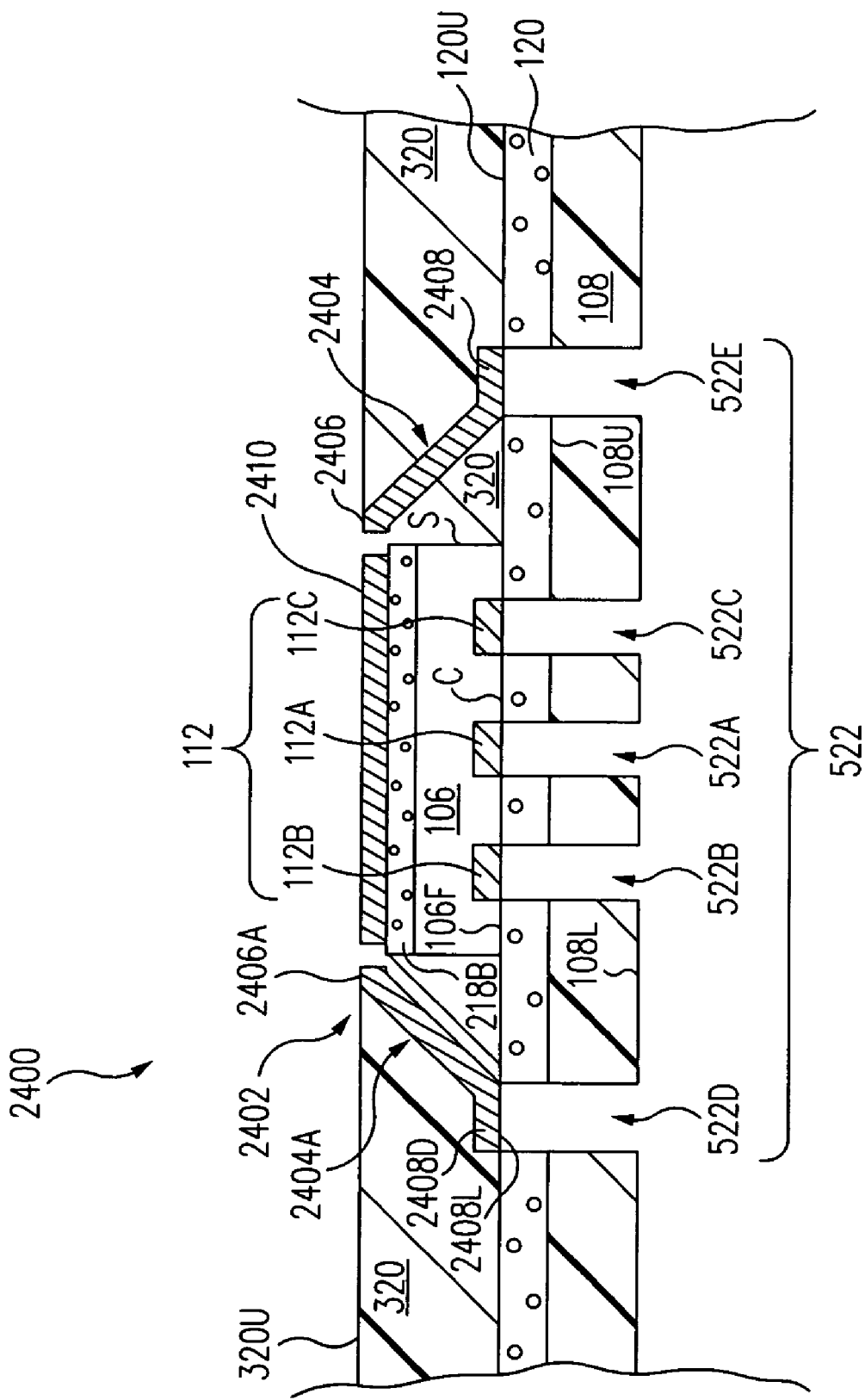

FIG. 28 is a cross-sectional view of assembly 2400 of FIG. 27 at a further stage during fabrication of stackable embedded leadframe package in accordance with one embodiment of the present invention. Assembly 2400 of FIG. 28 is similar to assembly 100B of FIG. 5 and only the significant differences are discussed below.

Referring now to FIG. 28, a plurality of via apertures 522 is formed using a laser, i.e., using laser ablation. Via apertures 522 are sometimes called first via apertures.

Via apertures 522 extend through dielectric strip 108 and through adhesive strip 120 to bond pads 112 of electronic component 106 and to lower mounting portion 2408 of each lead 2404 in the plurality of leads 2404.

In one embodiment, via apertures 522 are cylindrical in shape. Bond pads 112 are exposed through via apertures 522, e.g., via apertures 522B, 522A, and 522C. Lower mounting portions 2408 of leads 2404 are exposed through via apertures 522, e.g., via apertures 522D and 522E.

In one embodiment, the laser intensity is set to be sufficient to remove dielectric strip 108 and adhesive strip 120. However, the laser intensity is set to be insufficient to remove bond pads 112 or lower mounting portions 2408 of leads 2404. Accordingly, pulsing of the laser forms a single via aperture 522 extending through dielectric strip 108 and through adhesive strip 120 to lower mounting portion 2408 of lead 2404 or to bond pad 112. The laser is then stepped to the next location to form next via aperture 522.

To illustrate, leads 2404 include lower mounting portions 2408D and 2408. Via apertures 522D and 522E of the plurality of via apertures 522 extend through dielectric strip 108 and through adhesive strip 120 to lower mounting portions 2408D and 2408, respectively. Via apertures 522B, 522A, and 522C of the plurality of via apertures 522 extend through dielectric strip 108 and through adhesive strip 120 to bond pads 112B, 112A, and 112C, respectively.

To further illustrate, initially, the laser is pulsed to form via aperture 522D associated with lower mounting portion 2408D. The laser is then stepped and pulsed again to form via aperture 522E associated with lower mounting portion 2408. The laser is then stepped and pulsed again to form via aperture 522C associated with bond pad 112C. The laser is stepped and pulsed repeatedly until all of via apertures 522 are formed. However, in another embodiment, a plurality of lasers is simultaneous pulsed to form some or all of via apertures 522 simultaneously. In yet other embodiments, via apertures 522 are formed using selective etching, mechanical drilling, or other techniques.

Figure 29:
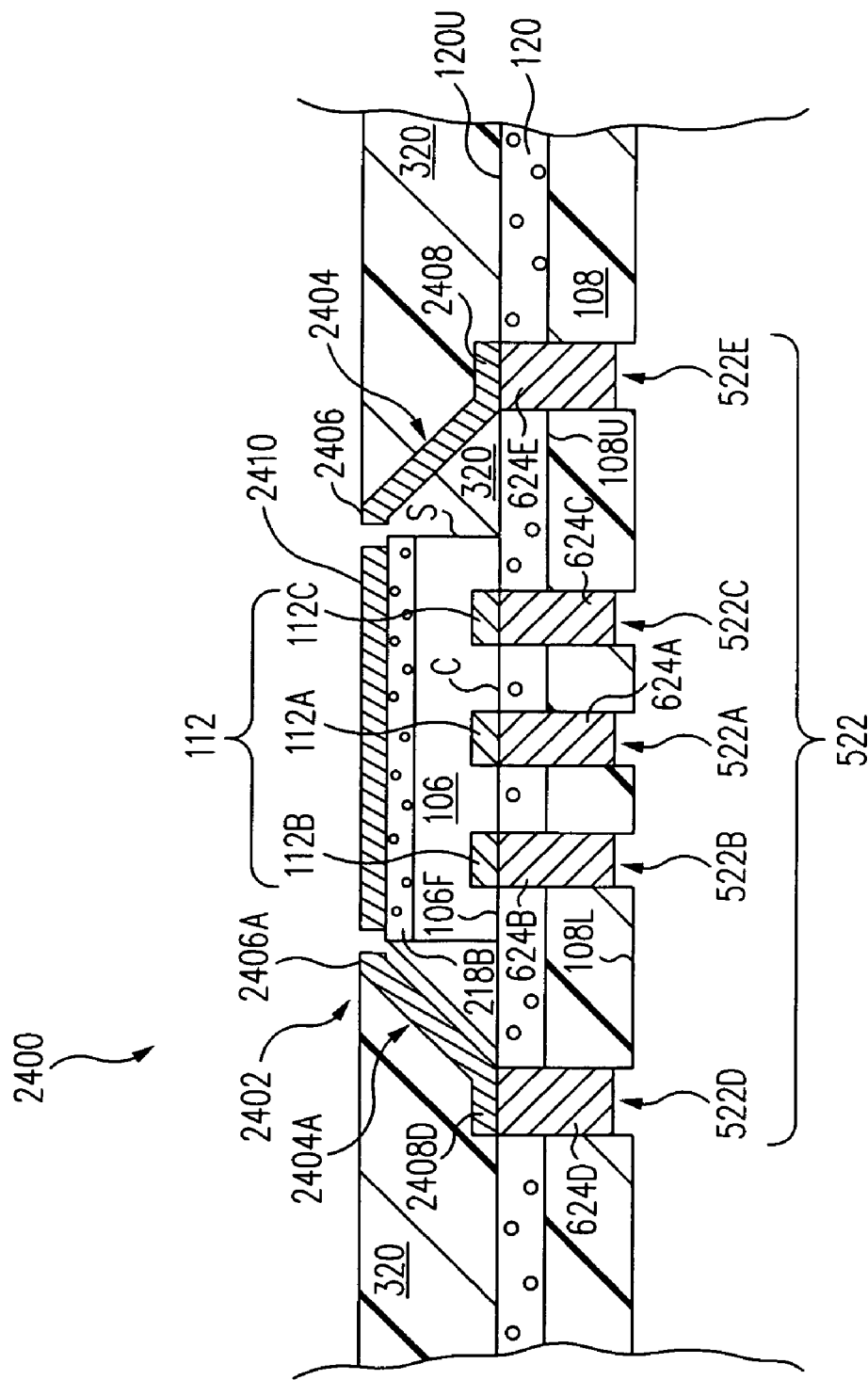

FIG. 29 is a cross-sectional view of assembly 2400 of FIG. 28 at a further stage during fabrication of the stackable embedded leadframe package in accordance with one embodiment of the present invention. Assembly 2400 of FIG. 29 is similar to assembly 100B of FIG. 6 and only the significant differences are discussed below.

Referring now to FIG. 29, via apertures 522 are filled with an electrically conductive material, e.g., a metal or metal containing material, an electrically conductive adhesive such as a silver filled adhesive or polymer, or solder paste, to form electrically conductive vias 624, illustrated as exemplary vias 624D, 624B, 624A, 624C, and 624E. Vias 624 are sometimes called first vias.

In one embodiment, copper or a copper-containing material is plated in via apertures 522 to form vias 624. In another embodiment, via apertures 522 are filled with an electrically conductive adhesive, which is then cured if necessary, to form vias 624. In yet another embodiment, via apertures 522 are filled with a solder paste. Assembly 2400 is then heated to reflow the solder paste to form vias 624.

After formation of vias 624, any excess electrically conductive material formed on lower surface 108L of dielectric strip 108 is removed. Illustratively, an etch or physical grinding process is used.

In one embodiment, an over-etch process is used to slightly over-etch vias 624. Thus, vias 624 remain recessed within via apertures 522. This ensures that shorting between vias 624 from excess electrically conductive material is avoided.

Vias 624 are electrically connected to corresponding bond pads 112 and to corresponding lower mounting portions 2408 of leads 2404.

To illustrate, vias 624B, 624A, and 624C of the plurality of vias 624 are electrically connected to bond pads 112B, 112A, and 112C, respectively. Vias 624 extend from bond pads 112, through adhesive strip 120 and through dielectric strip 108 to be adjacent or slightly recessed from lower surface 108L of dielectric strip 108.

Similarly, vias 624D and 624E of the plurality of vias 624 are electrically connected to lower mounting portions 2408D and 2408, respectively. Vias 624 extend from lower mounting portions 2408, through adhesive strip 120 and through dielectric strip 108 to be adjacent to, or slightly recessed from, lower surface 108L of dielectric strip 108.

Bond pads 112 and lower mounting portions 2408 are directly connected to corresponding vias 624. Stated another way, bond pads 112 and lower mounting portions 2408 are electrically connected to corresponding vias 624 without the use of a solder, e.g., without the use of flip chip bumps, and without the need to form a solder wetting layer, e.g., a nickel/gold layer, on bond pads 112 or on lower mounting portions 2408. This maximizes the reliability of the electrical connection between vias 624 and bond pads 112/lower mounting portions 2408, while at the same time minimizes impedance.

Further, since dielectric strip 108 is directly attached to electronic component 106 by adhesive strip 120 and bond pads 112/lowering mounting portions 2408 are directly connected to corresponding vias 624, the use of an underfill material is obviated. This simplifies manufacturing, enhances reliability, and thus reduces cost.

After formation of vias 624, assembly 2400 is inspected, e.g., optically using an automatic inspection system, to insure that all via apertures 522 are properly filled with electrically conductive material, i.e., to inspect the integrity of vias 624. In one embodiment, any defective or unformed vias 624 detected during the inspection are corrected, e.g., by etch removal of vias 624, reapplication of the electrically conductive material to reform vias 624, e.g., re-plating, and removal of any excess electrically conductive material on lower surface 108L of dielectric strip 108.

In this manner, the stackable embedded leadframe packages are fabricated with a maximum yield, e.g., essentially a 100 percent yield. This further minimizes the fabrication cost of the stackable embedded leadframe packages.

Figure 30:
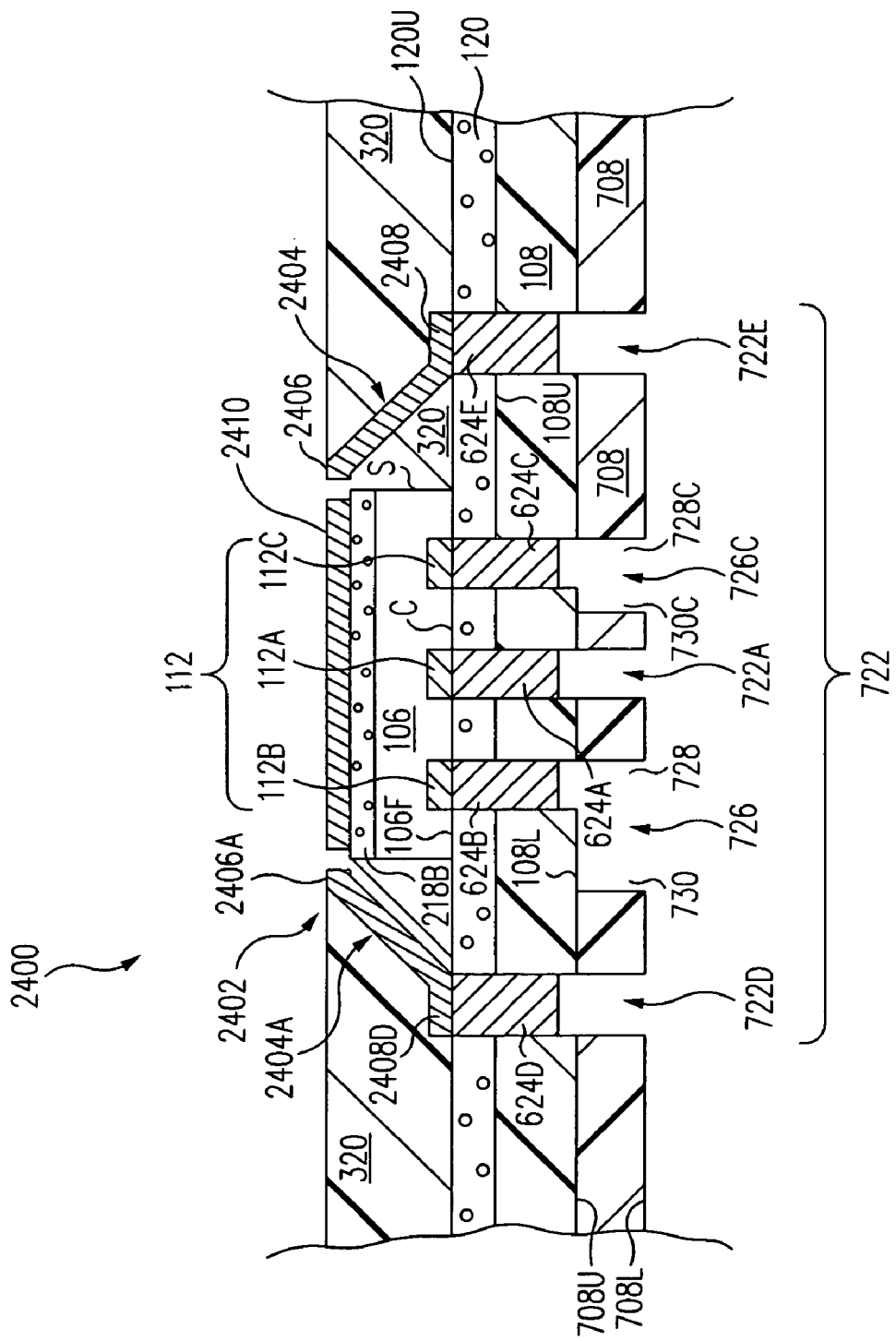

FIG. 30 is a cross-sectional view of assembly 2400 of FIG. 29 at a further stage during fabrication of the stackable embedded leadframe package in accordance with one embodiment of the present invention. Assembly 2400 of FIG. 30 is similar to assembly 100B of FIG. 7 and only the significant differences are discussed below.

Referring now to FIG. 30, a second dielectric strip 708 is mounted to dielectric strip 108, e.g., a first dielectric strip. More particularly, an upper, e.g., first, surface 708U of second dielectric strip 708 is mounted to lower surface 108L of first dielectric strip 108. Second dielectric strip 708 is mounted in the same or similar manner as previously described in FIG. 7, so mounting of second dielectric strip 708 is not discussed in detail to avoid detracting from the principles of the invention.

A plurality of via apertures 722, e.g., via apertures 722D, 722A, and 722E, and a plurality of trace channels 726, e.g., trace channel 726C, are formed using a laser, i.e., using laser ablation. Via apertures 722 and trace channels 726 extend through dielectric strip 708 and to vias 624. Via apertures 722 are sometimes called second via apertures.

In one embodiment, via apertures 722 are cylindrical in shape and extend vertically, i.e., in a first direction perpendicular to front surface 106F of electronic component 106, through dielectric strip 708 to vias 624.

To illustrate, via aperture 722D extends through dielectric strip 708 to via 624D.

Trace channels 726 are trenches extending horizontally, i.e., in a second direction perpendicular to the first direction and parallel to front surface 106F of electronic component 106, from vias 624. Trace channels 726 are associated with lower mounting portions 2408 and/or bond pads 112.

To further illustrate, trace channel 726 extends through dielectric strip 708 to via 624B. More particularly, via 624B is exposed at a first end 728 of trace channel 726. Trace channel 726 extends horizontally outwards from a center C of electronic component 106 and outwards from via 624B to a second end 730 of trace channel 726 in a fan-out configuration.

To further illustrate, a second trace channel 726C of the plurality of trace channels 726 extends through dielectric strip 708 to via 624C. More particularly, via 624C is exposed at a first end 728C of trace channel 726C. Trace channel 726C extends horizontally inwards toward center C from via 624C to a second end 730C of trace channel 726C in a fan-in configuration.

Via apertures 722 and trace channels 726 are formed in a manner similar to via apertures 722 and trace channels 726 discussed in FIG. 7, so formation of via apertures 722 and trace channels 726 is not discussed in detail to avoid detracting from the principles of the invention.

Figure 31:
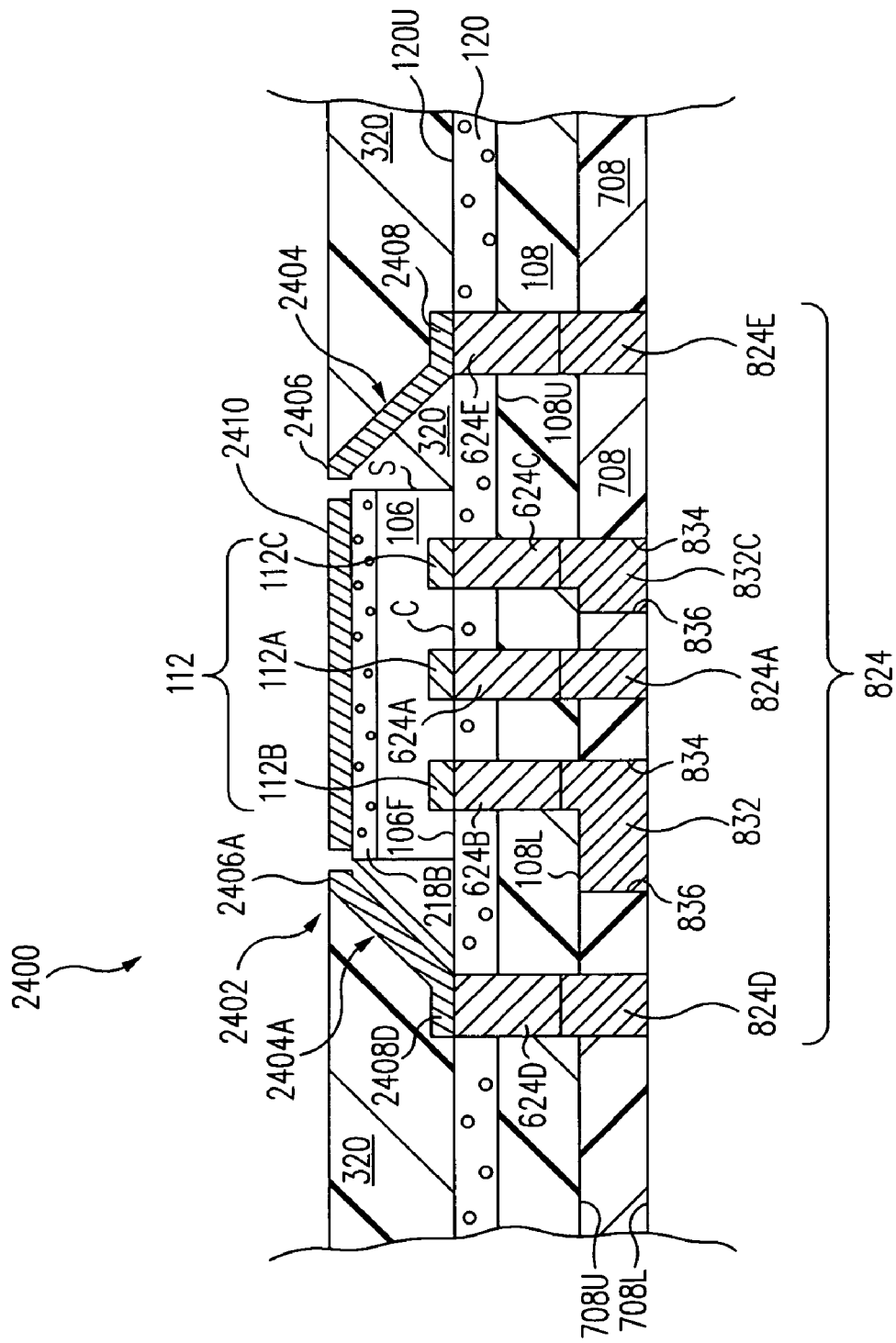

FIG. 31 is a cross-sectional view of assembly 2400 of FIG. 30 at a further stage during fabrication of the stackable embedded leadframe package in accordance with one embodiment of the present invention. Assembly 2400 of FIG. 31 is similar to assembly 100B of FIG. 8 and only the significant differences are discussed below.

Referring now to FIGS. 30 and 31 together, via apertures 722 and trace channels 726 are filled with an electrically conductive material, e.g., a metal or metal containing material, an electrically conductive adhesive, or solder paste, to form electrically conductive vias 824 and electrically conductive traces 832, respectively. Vias 824 are sometimes called second vias.

In one embodiment, vias 824, and traces 832, are similar to vias 824 and traces 832 discussed in FIG. 8, so formation of vias 824 and traces 832 is not discussed in detail to avoid detracting from the principles of the invention.

In one embodiment, vias 824 and/or traces 832 are associated with lower mounting portions 2408 and/or bond pads 112. To illustrate, a first via 824D in the plurality of vias 824 is electrically connected to via 624D. A second via 824A in the plurality of vias 824 is electrically connected to via 624A. A third via 824E in the plurality of vias 824 is electrically connected to via 624E.

Although a fan-out trace and a fan-in trace, i.e., traces 832 and 832C, respectively, are illustrated and previously discussed with reference to traces 832B and 832C of FIG. 8, in other embodiments, only fan-in traces or fan-out traces are formed.

After formation of vias 824 and traces 832, assembly 2400 is inspected to insure that all via apertures 722 and trace channels 726 are properly filled with electrically conductive material, i.e., to inspect the integrity of vias 824 and traces 832.

In one embodiment, any defective or unformed vias 824 and traces 832 detected during the inspection are corrected, e.g., by etch removal of vias 824 and traces 832, reapplication of the electrically conductive material to reform vias 824 and traces 832, and removal of any excess electrically conductive material on lower surface 708L of dielectric strip 708. In this manner, the stackable embedded leadframe package is fabricated with maximum yield.

Figure 32:
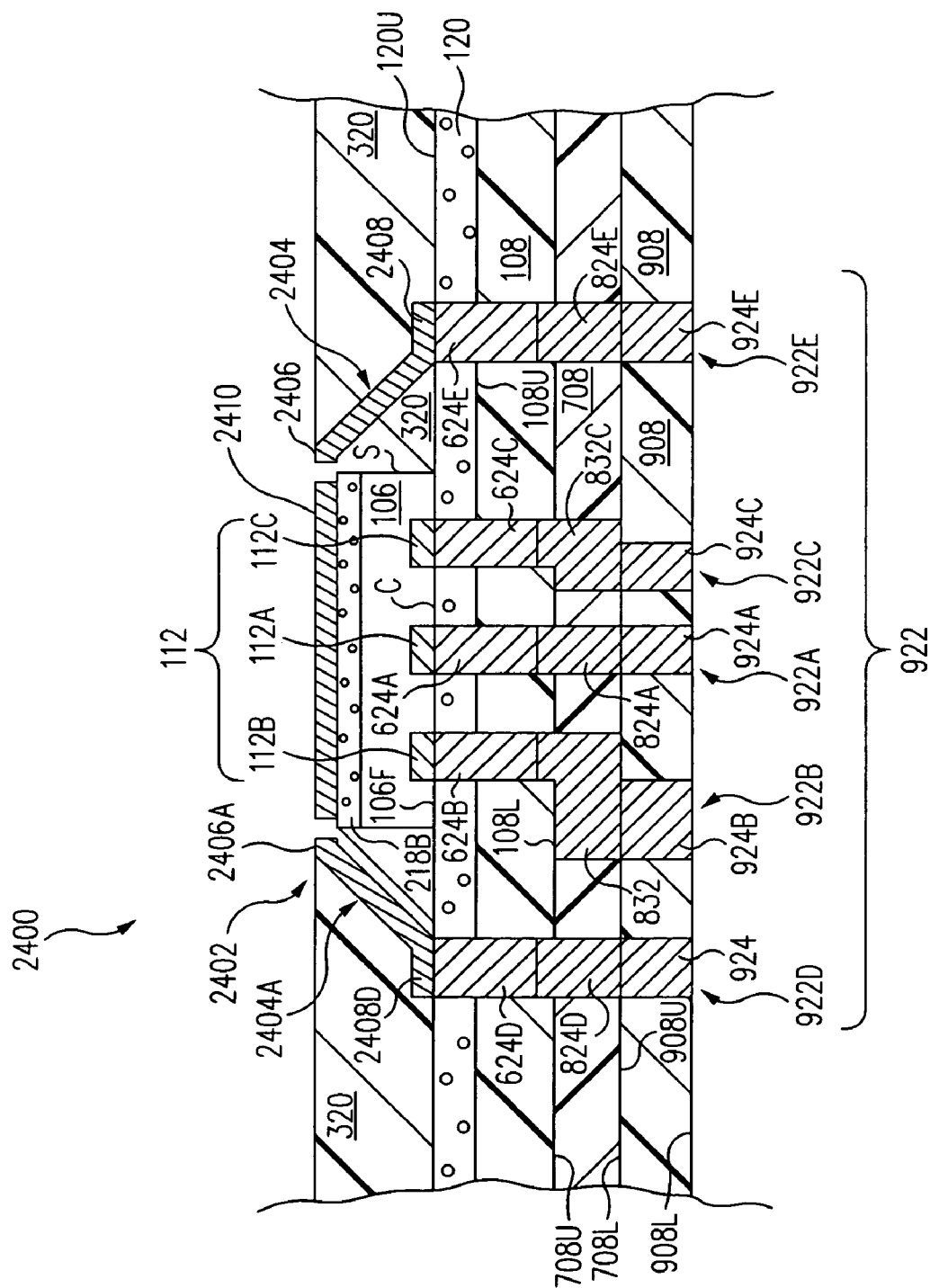

FIG. 32 is a cross-sectional view of assembly 2400 of FIG. 31 at a further stage during fabrication of the stackable embedded leadframe package in accordance with one embodiment of the present invention. Assembly 2400 of FIG. 32 is similar to assembly 100B of FIG. 9 and only the significant differences are discussed below.

Referring now to FIG. 32, a third dielectric strip 908 is mounted to dielectric strip 708. More particularly, an upper, e.g., first, surface 908U of dielectric strip 908 is mounted to lower surface 708L of dielectric strip 708. Dielectric strip 908 is similar to dielectric strip 708 and mounted in a manner similar to that discussed above with regard to mounting of dielectric strip 708 to dielectric strip 108.

A plurality of via apertures 922 is formed using a laser, i.e., using laser ablation. Via apertures 922 extend through dielectric strip 908 to vias 824 and traces 832. In one embodiment, via apertures 922 are cylindrical in shape. Via apertures 922 are sometimes called third via apertures.

Vias 824 and traces 832 are exposed through via apertures 922.

Via apertures 922 are formed in a manner similar to via apertures 922 of FIG. 9, so formation of via apertures 922 is not discussed in detail to avoid detracting from the principles of the invention.

Via apertures 922 are filled with an electrically conductive material, e.g., a metal or metal containing material, an electrically conductive adhesive, or solder paste, to form electrically conductive vias 924, e.g., vias 924B, 924A, 924C, and 924E. Via apertures 922 are filled to form vias 924 in a manner similar to that discussed with regard to vias 924 of FIG. 9 so formation of vias 924 is not discussed in detail to avoid detracting from the principles of the invention. Vias 924 are sometimes called third vias.

After formation of vias 924, any excess electrically conductive material formed on a lower, e.g., second, surface 908L of dielectric strip 908 is removed. Illustratively, an etch or physical grinding process is used. In one embodiment, an over-etch process is used to slightly over-etch vias 924. Thus, vias 924 remain recessed within via apertures 922. This ensures that shorting between vias 924 from excess electrically conductive material is avoided.

Vias 924 are electrically connected to corresponding vias 824 and traces 832. To illustrate, vias 924B, 924A, 924C, and 924E of the plurality of vias 924 are electrically connected to trace 832, via 824A, trace 832C, and via 824E, respectively. Vias 924 extend from vias 824 and traces 832 through dielectric strip 908 to be adjacent or slightly recessed from lower surface 908L of dielectric strip 908.

In one embodiment, vias 924 are formed to have a larger diameter than the width of traces 832 and/or the diameter of vias 824. By forming vias 924 with the appropriate diameter, tolerance in the positioning of vias 924 is accommodated. Stated another way, by forming vias 924 with a sufficiently large diameter, electrical contact between vias 924 and vias 824/traces 832 is assured.

After formation of vias 924, assembly 2400 is inspected to insure that all via apertures 922 are properly filled with electrically conductive material, i.e., to inspect the integrity of vias 924.

In one embodiment, any defective or unformed vias 924 detected during the inspection are corrected, e.g., by etch removal of vias 924, reapplication of the electrically conductive material to reform vias 924, and removal of any excess electrically conductive material on lower surface 908L of dielectric strip 908. In this manner, the stackable embedded leadframe packages are fabricated with a maximum yield.

Figure 33:
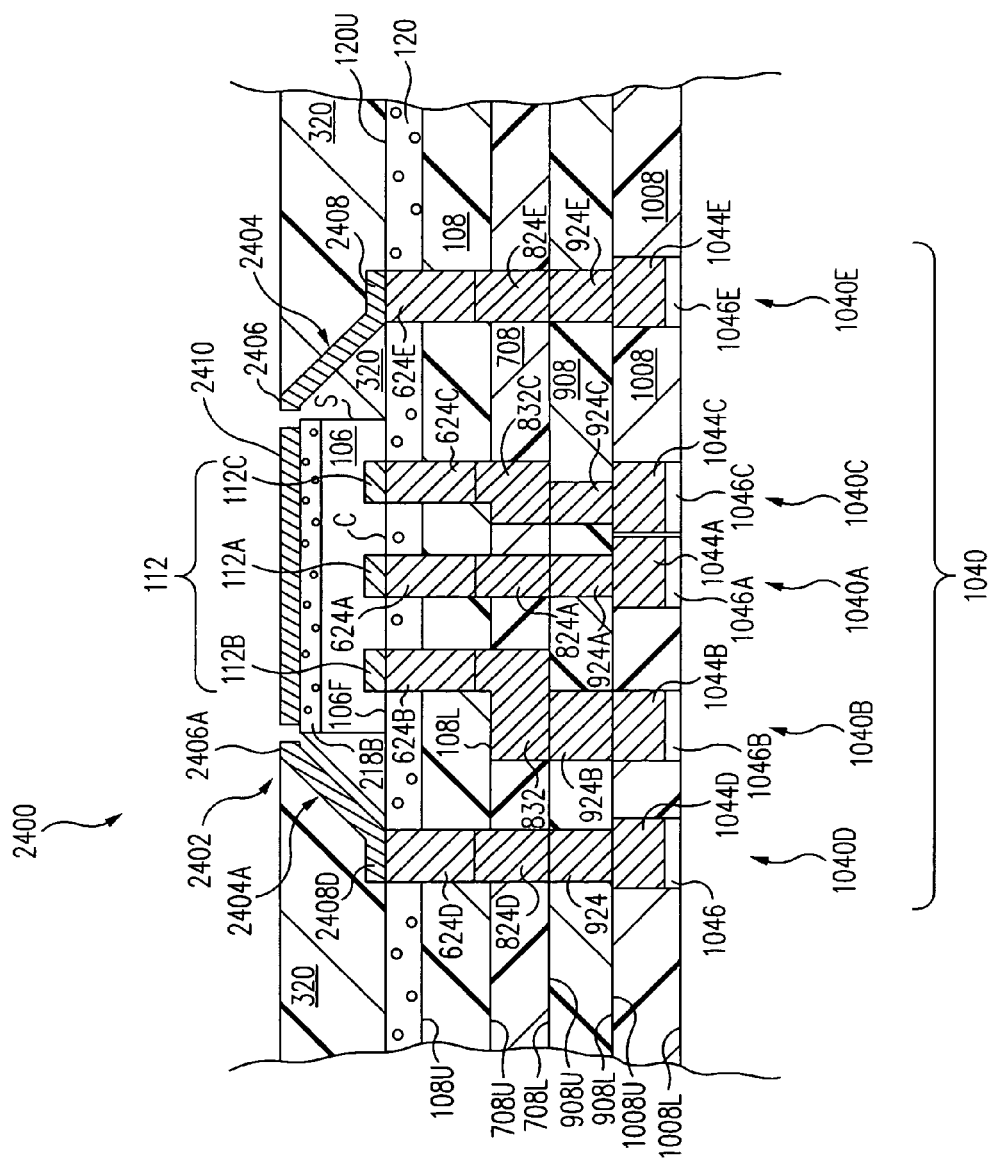

FIG. 33 is a cross-sectional view of assembly 2400 of FIG. 32 at a further stage during fabrication of the stackable embedded leadframe package in accordance with one embodiment of the present invention. Assembly 2400 of FIG. 32 is similar to assembly 100B of FIG. 10 and only the significant differences are discussed below.

Referring now to FIG. 33, a fourth dielectric strip 1008 is mounted to dielectric strip 908. More particularly, an upper, e.g., first, surface 1008U of dielectric strip 1008 is mounted to lower surface 908L of dielectric strip 908. Dielectric strip 1008 is similar to dielectric strip 1008 discussed in FIG. 10 and is mounted in a manner similar to that discussed with regard to mounting of dielectric strip 708 to dielectric strip 108.

A plurality of land apertures 1040 is formed using a laser, i.e., using laser ablation. Land apertures 1040 extend through dielectric strip 1008 to vias 924. In one embodiment, land apertures 1040 are cylindrical in shape but can be patterned in a variety of shapes depending upon the particular interconnection structure used, e.g., interconnection balls or lands.

Vias 924 are exposed through land apertures 1040. To illustrate, land apertures 1040D and 1040E, of the plurality of land apertures 1040, extend through dielectric strip 1008 to vias 924 and 924E, respectively.

Land apertures 1040 are formed in a manner similar to via apertures 1040 of FIG. 10 so formation of land apertures 1040 is not discussed in detail to avoid detracting from the principles of the invention.

Land apertures 1040 are filled with an electrically conductive material, e.g., a metal or metal-containing material, an electrically conductive adhesive, or solder paste, to form electrically conductive lands 1044, illustrated as exemplary lands 1044D, 1044B, 1044A, 1044C, and 1044E. Land apertures 1040 are filled to form lands 1044 in a manner similar to that discussed with regard to lands 1044 of FIG. 10 so formation of lands 1044 is not discussed in detail to avoid detracting from the principles of the invention.

After formation of lands 1044, any excess electrically conductive material formed on a lower, e.g., second, surface 1008L of dielectric strip 1008 is removed. Illustratively, an etch or physical grinding process is used.

In one embodiment, an over-etch process is used to slightly over-etch lands 1044. Thus, lands 1044 remain recessed within land apertures 1040. This ensures that shorting between lands 1044 from excess electrically conductive material is avoided.

Lands 1044 are electrically connected to corresponding vias 924. To illustrate, lands 1044D and 1044E of the plurality of lands 1044 are electrically connected to vias 924 and 924E, respectively. Lands 1044 extend from vias 924 through dielectric strip 1008 to be adjacent or slightly recessed from lower surface 1008L of dielectric strip 1008.

After formation of lands 1044, assembly 2400 is inspected to insure that all land apertures 1040 are properly filled with electrically conductive material, i.e., to inspect the integrity of lands 1044. In one embodiment, any defective or unformed lands 1044 detected during the inspection are corrected, e.g., by etch removal of lands 1044, reapplication of the electrically conductive material to reform lands 1044, and removal of any excess electrically conductive material on lower surface 1008L of dielectric strip 1008. In this manner, the stackable embedded leadframe packages are fabricated with a maximum yield.

After formation of lands 1044, in one embodiment, a solder on paste (SOP) is applied to lands 1044. This solder on paste is reflowed, i.e., heated to a melt and cooled to resolidify, to form solder lands 1046, e.g., 1046B, 1046A, 1046C, and 1046E.

In accordance with this embodiment, the resulting electronic component package is a land grid array package. The solder lands are used to electrically connect the electronic component package to the larger substrate, e.g., a mother or daughter board, for example, using a high lead solder such as a 90/10 lead/tin solder.

In another embodiment, a ball grid array package is formed. More particularly, after formation of lands 1044, an organic solderability protectant (OSP) 1046, sometimes called an organic solderability preservative, is applied to lands 1044. The organic solderability protectant, e.g., OSP 1046B, 1046A, 1046C, and 1046E in accordance with this embodiment, enhances the solder wet-ability of lands 1044A. For simplicity of discussion, the organic solderability protectant is hereinafter referred to as OSP 1046. However, in another embodiment, OSP 1046 is not used.

Figure 34:
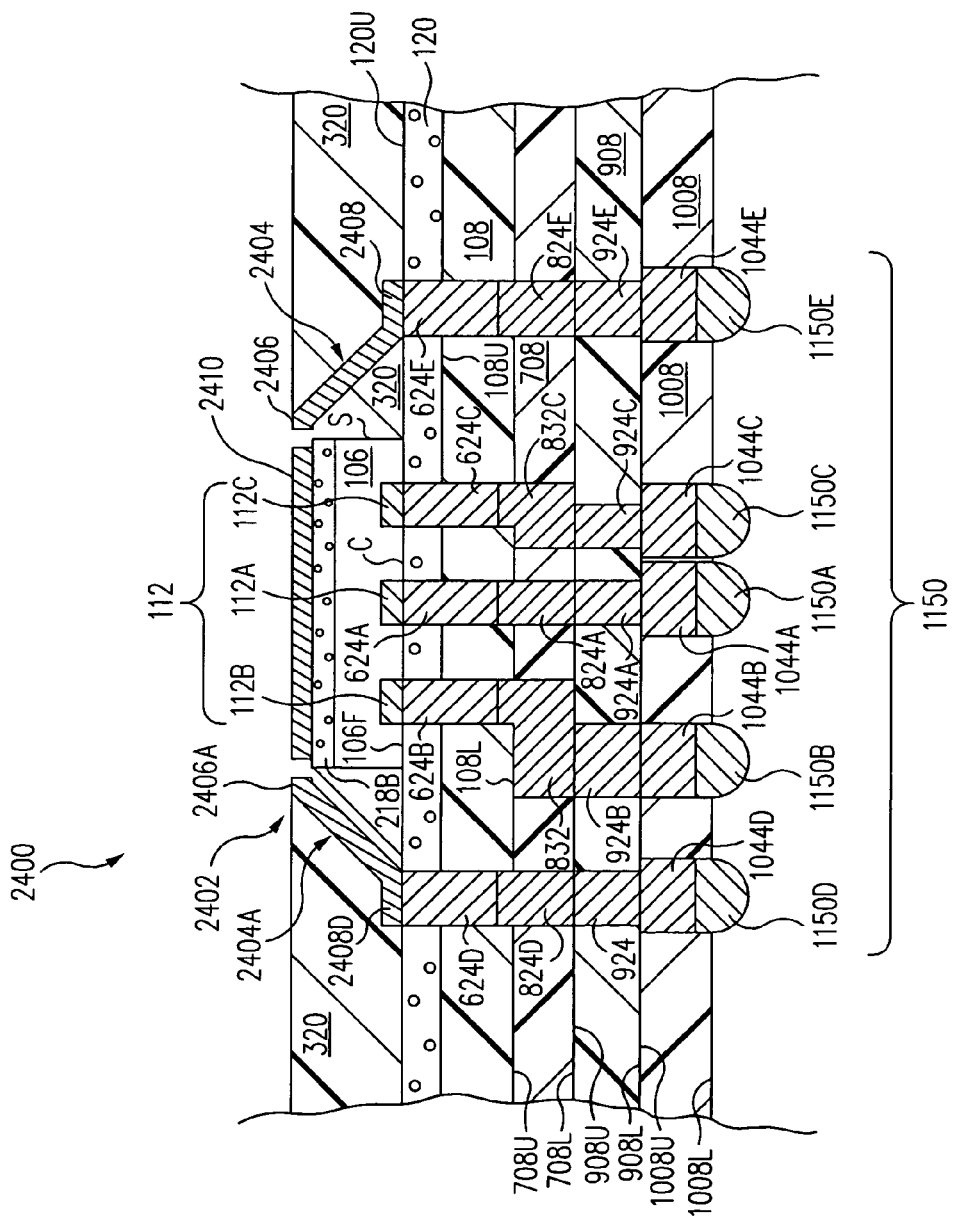

FIG. 34 is a cross-sectional view of assembly 2400 of FIG. 33 at a further stage during fabrication of the stackable embedded leadframe package in accordance with one embodiment of the present invention. Assembly 2400 of FIG. 34 is similar to assembly 100B of FIG. 11 and only the significant differences are discussed below.

Referring now to FIG. 34, electrically conductive interconnection balls 1150, e.g., eutectic lead/tin solder, are formed on lands 1044. Interconnection balls 1150 are formed in a conventional manner. During formation of interconnection balls 1150, OSP 1046 is consumed.

Interconnection balls 1150 are used to electrically connect assembly 2400 to the larger substrate, e.g., a mother or daughter board.

Each interconnection ball 1150 is electrically connected to a corresponding bond pad 112 and to a corresponding lower mounting portion 2408 as discussed above. In this manner, the pattern of bond pads 112 and lower mounting portions 2408 is redistributed to the pattern of interconnection balls 1150. Although an array pattern of interconnection balls 1150 is discussed above, interconnection balls 1150 are distributed in any one of a number of desired patterns in other embodiments.

Further, interconnection balls 1150 are connected to bond pads 112 and to lower mounting portions 2408 using a minimum path length. To illustrate, lower mounting portion 2408D is coupled to a first interconnection ball 1150D of the plurality of interconnection balls 1150 by vias 624D, 824D, 924, and land 1044D, which are directly aligned with one another. By using a minimum path length, heat transfer between bond pads 112/lower mounting portions 2408 and more generally between electronic component 106/leads 2404 and interconnection balls 1150 is maximized, thus improving the thermal performance of the stackable embedded leadframe package. For similar reasons, impedance between bond pads 112/lower mounting portions 2408 and interconnection balls 1150 is minimized.

As set forth above, (1) a dielectric strip is applied; (2) the dielectric strip is laser patterned to form via apertures and/or trace channels; (3) the via apertures and/or the trace channels are filled with an electrically conductive material to form vias and/or traces; (4) excess electrically conductive material is removed from a lower surface of the dielectric strip; and (5) the formed vias and/or the traces are inspected and corrected, if necessary. This process is repeated any number of desired times until a desired redistribution is achieved.

Further, since via apertures 522, 722, 922 and/or trace channels 726 are formed with a laser in one embodiment, any changes in the design layout of via apertures 522, 722, 922 and/or trace channels 726 are relatively simple to execute.

More particularly, these design layout changes are made in the computer software, e.g., the CAD software, which drives the laser. Accordingly, the design layout changes are made with some relatively simple programming and executed immediately.

Referring still to FIG. 34, although four dielectric strips 108, 708, 908, and 1008 are illustrated and discussed above, more or less than four dielectric strips are used in other embodiments. Generally, at least one dielectric strip, e.g., dielectric strip 108, is used.

Further, although vias 624, 824, 924, traces 832, and lands 1044 are discussed above as being formed in various dielectric strips 108, 708, 908, and 1008 for purposes of discussion, in light of this disclosure, those of skill in the art will understand that vias, traces, lands and/or combinations thereof can be formed in any single dielectric strip 108, 708, 908, or 1008.

Further, although vias 624, 824, 924, traces 832, and lands 1044 are discussed as distinct types of structures for purposes of discussion, in light of this disclosure, those of skill in the art will understand that vias 624, 824, 924, traces 832, and lands 1044 can be similar in structure. For example, a via or trace can form a land.

Still further, via apertures 522, 722, 922, trace channels 726 and land apertures 1040 are filled immediately after formation, i.e., before application of next dielectric strip, with an electrically conductive material to form vias 624, 824, 924, traces 832 and lands 1044, respectively, in the discussion above. However, in an alternative embodiment, via apertures 522, 722, 922, trace channels 726 and land apertures 1040 are formed in some or all of dielectric strips 108, 708, 908, and 1008. After formation, via apertures 522, 722, 922, trace channels 726 and land apertures 1040 are filled at the same time, e.g., in a single plating operation, with an electrically conductive material to form vias 624, 824, 924, traces 832 and lands 1044, respectively.

Figure 35:
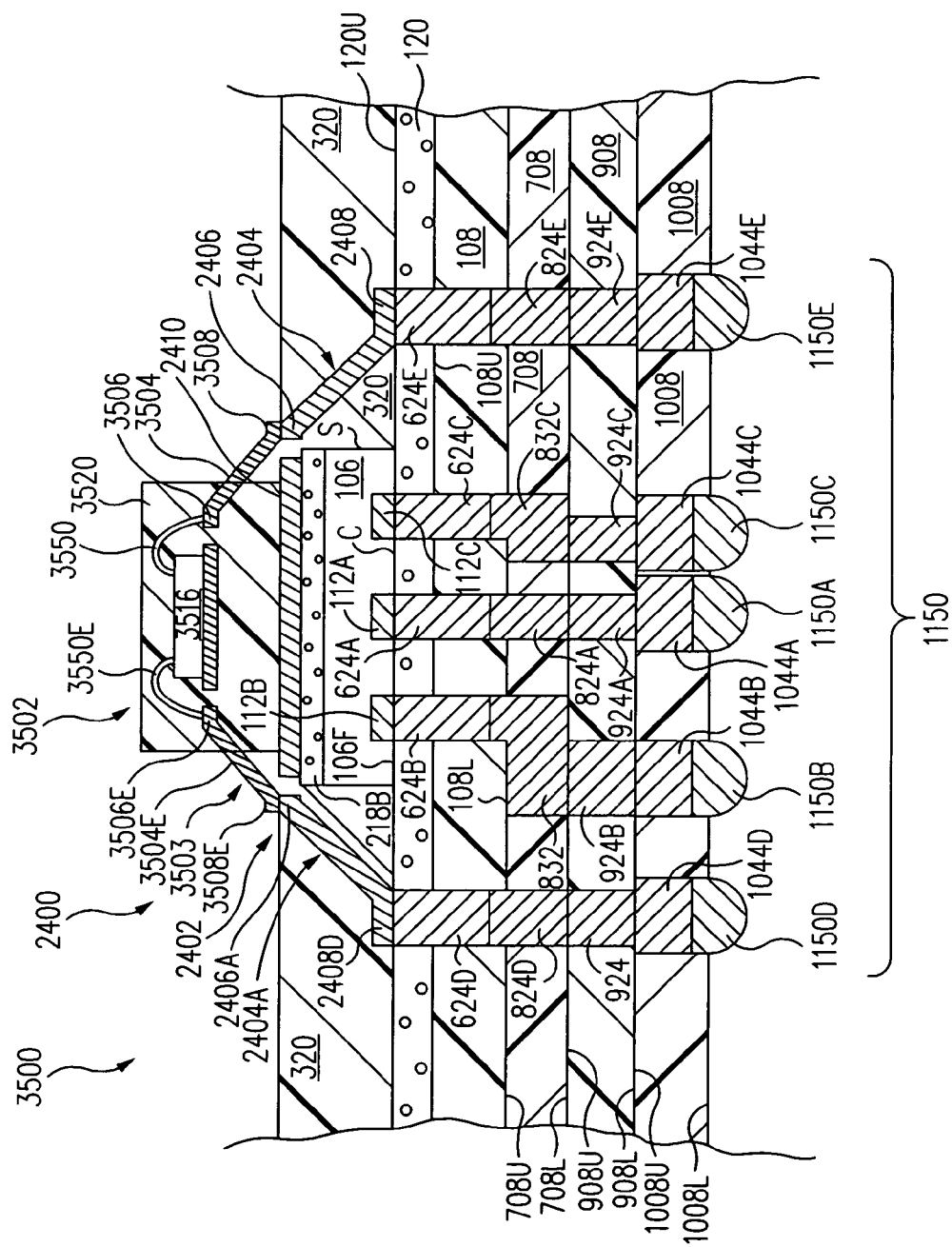
FIG. 35 is a cross-sectional view illustrating a manner in which a second electronic component package is stacked upon a first electronic component package in a stackable embedded leadframe package, in accordance with one embodiment of the present invention.

FIG. 35 is a cross-sectional view of a second electronic component package stacked on a first electronic component package to form a stackable embedded leadframe package 3500, in accordance with one embodiment of the present invention. Referring now to FIG. 35, there is shown stackable embedded leadframe package 3500. Stackable embedded leadframe package 3500, for example, comprises two or more electronic components and/or electronic component packages in a stacked configuration, as described below.

In one embodiment, stackable embedded leadframe package 3500 is similar in construction to first assembly 2400 of FIG. 34, the primary distinction being that a second electronic component package 3502, sometimes called a second assembly, is mounted on, and in electrical communication with, first assembly 2400. Second assembly 3502 and first assembly 2400 form stackable embedded leadframe package 3500.

In one embodiment, second assembly 3502 includes a second leadframe 3503 having a second support plate 3510 and a plurality of second leads 3504. Each second lead 3504 in the plurality of second leads 3504 has a second terminal portion 3506 and a second lower mounting portion 3508. Each second lead 3504 in the plurality of second leads 3504 is segregated from second support plate 3510 and from each other.

A second electronic component 3516 is mounted on second support plate 3510. Second electronic component 3516 is partially or wholly encapsulated in a second encapsulant 3520.

First assembly 2400 allows for stacking of second assembly 3502. More particularly, in one embodiment, exposed surfaces of first terminals 2406, e.g., upper surface 2406U (shown in FIG. 26), of first terminal portions 2406 of first leads 2404 of first leadframe 2402 and exposed upper surface 2410U (shown in FIG. 26) of first support plate 2410 of first leadframe 2402 define a "footprint" which allows for the stacking of second assembly 3502 upon first assembly 2400 and further allows electrical connection of second assembly 3502 to first assembly 2400.

In this regard, such electrical connection is facilitated by placing second leads 3504 of second assembly 3502 into electrical connection with respective exposed surface of first terminal portions 2406 of first leads 2404 of first leadframe 2402, previously described.

To illustrate, a conductive wire 3550E of a plurality of conductive wires 3550 electrically connects second electronic component 3516 of second assembly 3502 to second terminal portion 3506E of second lead 3504E in the plurality of second leads 3504. Second lower mounting portion 3508E of second lead 3504E in the plurality of second leads 3504 electrically connects to first terminal portion 2406A of first lead 2404A in the plurality of first leads 2404 of first assembly 2400. First lead 2404A is electrically connected to interconnection ball 1150D, as previously described.

As will be recognized, the number of bond pads 112 of first assembly 2400 used in electronic component package 3500 may vary to accommodate the specific configuration of electronic component(s)/electronic component package(s). The fabrication methodology employed for stackable embedded leadframe package 3500 is also substantially similar to that described above in relation to assembly 2400 as shown in FIG. 34, the distinction lying in the manner in which electronic component 3516 is electrically connected to a substrate, e.g., second support plate 3510, in comparison to the manner in which electronic component 106 is electrically connected to a substrate, e.g., dielectric strip 108.

One skilled in the art will recognize, however, that various assemblies are used in various embodiments. For example, second assembly 3502 alternatively comprises a BGA, LGA, leadframe technology, and/or active and passive components such as capacitors.

This disclosure provides exemplary embodiments of the present invention. The scope of the present invention is not limited by these exemplary embodiments. Numerous variations, whether explicitly provided for by the specification or implied by the specification or not, such as variations in structure, dimension, type of material and manufacturing process, are implemented by one of skill in the art in view of this disclosure.

What is claimed is:

1. A method of forming a stackable embedded leadframe package comprising:

coupling a first surface of a first electronic component to a first surface of a first dielectric strip, the first electronic component comprising bond pads on the first surface of the first electronic component;

coupling a leadframe on the first surface of the first dielectric strip, the leadframe comprising a support plate and a plurality of leads, each lead in the plurality of leads having a terminal portion and a lower mounting portion, the lower mounting portion being connected to the first surface of the first dielectric strip;

forming an electronic component package body by encapsulating the first electronic component and partially encapsulating the leadframe such that portions of the leadframe are exposed in a principal surface of the electronic component package body;

singulating each lead in the plurality of leads;

forming first via apertures through the first dielectric strip to expose the bond pads and the lower mounting portion of each lead in the plurality of leads; and filling the first via apertures with an electrically conductive material to form first vias electrically coupled to the bond pads and to the lower mounting portion of each lead in the plurality of leads.

2. The method of claim 1, wherein excess electrically conductive material is formed on a second surface of the first dielectric strip, the method further comprising removing the excess electrically conductive material from the second surface of the first dielectric strip.

3. The method of claim 2, wherein the removing the excess electrically conductive material from the second surface of the first dielectric strip is performed using an etch process.

4. The method of claim 3, wherein the first vias extend from the bond pads and from the lower mounting portion of each lead in the plurality of leads through the first dielectric strip to be adjacent to the second surface of the first dielectric strip.

5. The method of claim 2, wherein the removing the excess electrically conductive material from the second surface of the first dielectric strip is performed using an over-etch process.

6. The method of claim 5, wherein the first vias extend from the bond pads and from the lower mounting portion of each lead in the plurality of leads through the first dielectric strip to be recessed from the second surface of the first dielectric strip.

7. The method of claim 2, further comprising inspecting integrity of the first vias.

8. The method of claim 7, wherein the first vias comprise defective first vias detected during the inspecting integrity of the first vias, the method further comprising correcting the defective first vias.

9. The method of claim 8, wherein the correcting the defective first vias comprises:
  removal of the first vias; and
  reapplication of the electrically conductive material in the first via apertures to reform the first vias.

10. The method of claim 1, wherein the electrically conductive material is selected from the group consisting of a metal, a metal-containing material, an electrically conductive adhesive, and a solder paste.

11. The method of claim 1, wherein the filling the first via apertures with an electrically conductive material comprises plating copper or a copper-containing material in the first via apertures.

12. The method of claim 1, wherein the coupling a first surface of a first electronic component to a first surface of a first dielectric strip comprises adhering the first surface of the first electronic component to the first surface of the first dielectric strip with an adhesive.

13. The method of claim 12, wherein the forming first via apertures further comprises forming the first via apertures to extend through the adhesive.

14. The method of claim 1, wherein the forming first via apertures is performed with a laser.

15. The method of claim 1, further comprising:
  coupling a second dielectric strip to the first dielectric strip;
  forming trace channels through the second dielectric strip to expose the first vias; and
  filling the trace channels with the electrically conductive material to form traces electrically coupled to the first vias.

16. The method of claim 1, further comprising:
  coupling a second dielectric strip to the first dielectric strip;
  forming second via apertures through the second dielectric strip to expose the first vias; and
  filling the second via apertures with the electrically conductive material to form second vias electrically coupled to the first vias.

17. The method of claim 1, further comprising coupling a second electronic component to the leadframe.

18. A method of forming a stackable embedded leadframe package comprising:
  coupling a first surface of a first electronic component to a first surface of a first dielectric strip, the electronic component comprising bond pads on the first surface of the electronic component;
  temporarily coupling a first surface of a support strip to a second surface of the first dielectric strip;
  coupling a leadframe on the first surface of the first dielectric strip, the leadframe comprising:
  a support plate having an upper surface; and
  a plurality of leads, each lead in the plurality of leads having a terminal portion and a lower mounting portion, the lower mounting portion being connected to the first surface of the first dielectric strip;
  forming a package body by encapsulating the first electronic component and partially encapsulating the leadframe such that portions of the leadframe are exposed in a principal surface of the electronic component package body;
  removing the support strip from the first dielectric strip;
  singulating each lead in the plurality of leads;
  forming first via apertures through the first dielectric strip to extend to the bond pads and the lower mounting portion of each lead in the plurality of leads;
  filling the first via apertures with an electrically conductive material to form vias electrically coupled to the bond pads and to the lower mounting portion of each lead in the plurality of leads, wherein the first vias extend from the bond pads and from the lower mounting portion of each lead in the plurality of leads through the first dielectric strip to be adjacent to the second surface of the first dielectric strip; and
  coupling a second electronic component to the upper surface of the leadframe, the second electronic component in electrical communication with the plurality of leads in the leadframe.

19. The method of claim 18, further comprising:
  coupling a second dielectric strip to the first dielectric strip;
  forming trace channels and second via apertures through the second dielectric strip to expose the first vias; and
  filling the trace channels and the second via apertures with the electrically conductive material to form traces and second vias, the traces and the second vias electrically coupled to the first vias.

20. An electronic component package comprising:
  an electronic component comprising a first surface having bond pads;
  a leadframe comprising a plurality of singulated leads, each lead in the plurality of singulated leads having a lower mounting portion;
  a package body encapsulating the electronic component and partially encapsulating the leadframe such that portions of the leadframe are exposed in a principal surface of the package body;
  a dielectric strip comprising a first surface coupled to the first surface of the electronic component and to the lower mounting portion of each lead in the plurality of singulated leads;
  via apertures through the first dielectric strip, the via apertures exposing the bond pads and the lower mounting portion of each lead in the plurality of leads; and
  vias filling the via apertures and extending through the dielectric strip and coupled to the bond pads of the electronic component and to the lower mounting portion of each lead in the plurality of singulated leads.

* * * * *